US011594698B2

United States Patent
Chung et al.

(10) Patent No.: US 11,594,698 B2
(45) Date of Patent: Feb. 28, 2023

(54) ELECTRIC DEVICE AND DISPLAY DEVICE COMPRISING QUANTUM DOTS WITH IMPROVED LUMINOUS EFFICIENCY

(71) Applicant: SAMSUNG ELECTRONICS CO., LTD., Suwon-si (KR)

(72) Inventors: Dae Young Chung, Suwon-si (KR); Hongkyu Seo, Anyang-si (KR); Yeonkyung Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 145 days.

(21) Appl. No.: 16/913,575

(22) Filed: Jun. 26, 2020

(65) Prior Publication Data

US 2020/0328368 A1 Oct. 15, 2020

Related U.S. Application Data

(63) Continuation-in-part of application No. 16/797,380, filed on Feb. 21, 2020, now Pat. No. 11,018,311, (Continued)

(30) Foreign Application Priority Data

Aug. 23, 2016 (KR) .................. 10-2016-0107064

(51) Int. Cl.
*H01L 51/50* (2006.01)
*H01L 51/52* (2006.01)

(52) U.S. Cl.
CPC ........ *H01L 51/502* (2013.01); *H01L 51/5215* (2013.01); *H01L 51/5218* (2013.01);
(Continued)

(58) Field of Classification Search
CPC .............. H01L 51/502; H01L 51/5215; H01L 51/5218; H01L 51/5036; H01L 51/5068; H01L 51/504
See application file for complete search history.

(56) References Cited

U.S. PATENT DOCUMENTS 4,766,048 A  8/1988  Hisamura
7,309,956 B2 12/2007 Raychaudhuri et al.
(Continued)

FOREIGN PATENT DOCUMENTS

GB  2465730 A   6/2010
KR  100835059 B1  6/2008
(Continued)

OTHER PUBLICATIONS

Non-Final Office Action dated Sep. 24, 2020 in U.S. Appl. No. 16/797,380.
(Continued)

*Primary Examiner* — Didarul A Mazumder
*Assistant Examiner* — Gustavo G Ramallo
(74) *Attorney, Agent, or Firm* — Cantor Colburn LLP

(57) ABSTRACT

An electronic device includes a first electrode and a second electrode facing each other, an emission layer comprising a plurality of quantum dots, wherein the emission layer is disposed between the first electrode and the second electrode; a first charge auxiliary layer disposed between the first electrode and the emission layer; and an optical functional layer disposed on the second electrode on a side opposite the emission layer, wherein the first electrode includes a reflecting electrode, wherein the second electrode is a light-transmitting electrode, wherein a region between the optical functional layer and the first electrode comprises a micro-
(Continued)

cavity structure, and a refractive index of the optical functional layer is greater than or equal to a refractive index of the second electrode.

36 Claims, 15 Drawing Sheets

Related U.S. Application Data which is a continuation of application No. 15/483,651, filed on Apr. 10, 2017, now Pat. No. 10,615,356.

(52) U.S. Cl.
CPC ...... *H01L 51/5265* (2013.01); *H01L 51/5275* (2013.01); *H01L 51/5231* (2013.01); *H01L 51/5262* (2013.01); *H01L 2251/5353* (2013.01)

(56) References Cited

U.S. PATENT DOCUMENTS

| | | | |
|---|---|---|---|
| 7,816,677 B2 | 10/2010 | Lee et al. | |
| 7,833,633 B2 | 11/2010 | Lee et al. | |
| 8,367,218 B2 | 2/2013 | Chen et al. | |
| 9,276,168 B2 | 3/2016 | Coe-Sullivan et al. | |
| 10,522,787 B1 | 12/2019 | Montgomery et al. | |
| 2002/0084747 A1 | 7/2002 | Fujieda et al. | |
| 2007/0001581 A1 | 1/2007 | Stasiak et al. | |
| 2008/0023272 A1 | 1/2008 | Takeda et al. | |
| 2008/0023724 A1 | 1/2008 | Takeda et al. | |
| 2009/0009057 A1 | 1/2009 | Lee et al. | |
| 2009/0087546 A1 | 4/2009 | Ilzumi et al. | |
| 2009/0212688 A1 | 8/2009 | Song et al. | |
| 2009/0302750 A1 | 12/2009 | Jun et al. | |
| 2012/0248410 A1* | 10/2012 | Murayama | G06F 16/22 257/13 |
| 2013/0038640 A1 | 2/2013 | Kajimoto | |
| 2013/0193416 A1 | 8/2013 | Shin | |
| 2014/0014896 A1 | 1/2014 | Chung et al. | |
| 2014/0110665 A1 | 4/2014 | Zhang et al. | |
| 2015/0069366 A1 | 3/2015 | Lunt et al. | |
| 2015/0194467 A1* | 7/2015 | Zhang | H01L 27/156 257/13 |
| 2015/0228700 A1 | 8/2015 | Cho et al. | |
| 2015/0228850 A1 | 8/2015 | Zheng et al. | |
| 2015/0236075 A1 | 8/2015 | Jeong | |
| 2015/0287846 A1 | 10/2015 | Helander et al. | |
| 2016/0005989 A1 | 1/2016 | Gu et al. | |
| 2016/0164039 A1 | 6/2016 | Im | |
| 2016/0293875 A1* | 10/2016 | Zhang | H01L 27/3246 |
| 2016/0329515 A1 | 11/2016 | Fleissner et al. | |
| 2017/0170406 A1 | 6/2017 | Choi et al. | |
| 2017/0373266 A1* | 12/2017 | Xu | H01L 51/5096 |
| 2018/0233626 A1* | 8/2018 | Kim | H01L 51/502 |

FOREIGN PATENT DOCUMENTS

| | | |
|---|---|---|
| KR | 1020090087274 A | 8/2009 |
| KR | 20140010719 A | 1/2014 |
| KR | 1020140097775 A | 8/2014 |

OTHER PUBLICATIONS

Office Action dated Mar. 24, 2021, of the corresponding European Patent Application No. 17186686.6.

European Search Report dated Feb. 1, 2018, of the corresponding European Patent Application No. 17186686.6.

Haowen Liang, et al., "High efficiency quantum dot and organic LEDs with a back-cavity and a high index substrate", J. Phys. D: Appl. Phys. 49 (2016) 145103.

Xuyong Yang, et al., "Light Extraction Efficiency Enhancement of Colloidal Quantum Dot Light-Emitting Diodes Using Large-Scale Nanopillar Arrays", Adv. Funct. Mater. 2014, 24, 5977-5984.

* cited by examiner

CIE x: 0.141, CIE y: 0.054

ELECTRIC DEVICE AND DISPLAY DEVICE COMPRISING QUANTUM DOTS WITH IMPROVED LUMINOUS EFFICIENCY

CROSS-REFERENCE TO RELATED APPLICATION

This application is a continuation in part of U.S. patent application Ser. No. 16/797,380, filed on Feb. 21, 2020, which is a continuation of U.S. patent application Ser. No. 15/483,651, filed on Apr. 10, 2017, which claims priority to and the benefit of Korean Patent Application No. 10-2016-0107064, filed in the Korean Intellectual Property Office on Aug. 23, 2016, and all the benefits accruing therefrom under 35 U.S.C. § 119, the entire contents of which are incorporated herein by reference.

BACKGROUND

1. Field

An electronic device and a display device including the same are disclosed.

2. Description of the Related Art

Quantum dots are a nanocrystal semiconductor material having a diameter of less than or equal to around 10 nm, and show quantum confinement effects. Quantum dots generate stronger intensity light in a narrower wavelength region than the commonly used phosphor. Quantum dots emit light while the excited electrons are transited from a conduction band to a valence band and emitted wavelengths vary based on a particle size of the quantum dots. Quantum dots can therefore be used obtain light in a desirable wavelength region by adjusting the size of the quantum dots.

Advantages to electronic devices having an emission layer including quantum dots include reduced production costs compared to organic light emitting diode (OLED) devices using an emission layer including phosphorescence and/or phosphor material. Additionally, different colors may be emitted by changing the size of the quantum dots, whereas OLED devices require the use of different organic materials in the emission layer for each emitted color of light.

The luminous efficiency of the emission layer including quantum dots is determined by an external quantum efficiency of quantum dots, a balance of charge carrier, and light extraction efficiency, and the like. There remains a need to improve the luminous efficiency of the quantum dot emission layer to provide more advanced electronic devices.

SUMMARY

An embodiment provides an electronic device having excellent luminous efficiency by improving light extraction efficiency, and a display device including the same.

According to an embodiment, an electronic device includes a first electronic device including a first quantum dot, the first quantum dot being configured to emit light in a first wavelength region; a second electronic device including a second quantum dot, the second quantum dot being configured to emit light in a second wavelength region shorter than the first wavelength region; and a third electronic device including a third quantum dot, the third quantum dot being configured to emit light in a third wavelength region shorter than the second wavelength region, wherein each of the first electronic device, the second electronic device, and the third electronic device includes: a first electrode including a reflective layer, a first charge auxiliary layer on the first electrode, the first charge auxiliary layer including a hole transport layer, a hole injection layer, or a combination thereof, an emission layer on the first charge auxiliary layer, the emission layer including the first quantum dot, the second quantum dot, or the third quantum dot, a second electrode on the emission layer, and an optical functional layer on the second electrode, wherein a distance between the reflective layer and the emission layer of the third electronic device is in a range of about 100 nanometers to about 160 nanometers, and a distance between the reflective layer and the emission layer of the first electronic device is different from the distance between the reflective layer and the emission layer of the third electronic device.

A thickness of the first charge auxiliary layer of the third electronic device may be in a range of about 100 nanometers to about 160 nanometers, and a thickness of the first charge auxiliary layer of the first electronic device may be different from the thickness of the first charge auxiliary layer of the third electronic device.

The thickness of the first charge auxiliary layer of the first electronic device may be about 0.1 times to about 0.9 times or about 1.2 times to about 3 times the thickness of the first charge auxiliary layer of the third electronic device.

The thickness of the first charge auxiliary layer of the first electronic device may be in a range of about 30 nanometers to about 80 nanometers or about 230 nanometers to about 280 nanometers.

A total thickness of the optical functional layer and the first charge auxiliary layer of the first electronic device may be in a range of about 40 nanometers to about 170 nanometers or about 240 nanometers to about 370 nanometers.

A total thickness of the optical functional layer and the first charge auxiliary layer of the third electronic device may be in a range of about 120 nanometers to 240 nanometers.

Each of the first electronic device, the second electronic device and the third electronic device may further include a second charge auxiliary layer between the emission layer and the second electrode, and the second charge auxiliary layer includes inorganic nanoparticles.

A refractive index of the second charge auxiliary layer may be less than a refractive index of the emission layer.

A difference between the refractive index of the emission layer and the refractive index of the second charge auxiliary layer may be greater than or equal to about 0.20.

A difference between the refractive index of the emission layer and the refractive index of the second charge auxiliary layer may be in a range of about 0.20 to about 1.0.

The second charge auxiliary layer may include zinc-containing oxide nanoparticles represented by $Zn_{1-x}Q_xO$ (wherein, Q is Mg, Co, Ni, Ga, Al, Ca, Zr, W, Li, Ti, Ta, Sn, Hf, Si, Ba, or a combination thereof, and $0 \le x < 0.5$).

A thickness of the second charge auxiliary layer of the first electronic device may be different from a thickness of the second charge auxiliary layer of the third electronic device.

The thickness of the second charge auxiliary layer of the first electronic device may be greater than a thickness of the second charge auxiliary layer of the third electronic device.

A total thickness of the first charge auxiliary layer, the emission layer, and the second charge auxiliary layer of the first electronic device may be in a range of about 75 nanometers to about 135 nanometers or about 270 nanometers to about 330 nanometers.

A total thickness of the first charge auxiliary layer, the emission layer, and the second charge auxiliary layer of the third electronic device may be in a range of about 160 nanometers to about 230 nanometers.

The optical functional layers of the first electronic device, the second electronic device, and the third electronic device may have the same thickness.

The emission layers of the first electronic device, the second electronic device, and the third electronic device may have the same thickness.

A full width at half maximum of wavelength spectrum of color displayed by the first electronic device may be narrower than a full width at half maximum of emission spectrum of the emission layer of the first electronic device, and a full width at half maximum of wavelength spectrum of color displayed by the third electronic device may be narrower than a full width at half maximum of emission spectrum of the emission layer of the third electronic device.

According to an embodiment, an electronic device includes a first electrode including a reflective layer, a first charge auxiliary layer on the first electrode, the first charge auxiliary layer including a hole transport layer, a hole injection layer, or a combination thereof, an emission layer on the first charge auxiliary layer, the emission layer including a quantum dot configured to emit a light in a blue wavelength region, a second electrode on the emission layer, and an optical functional layer on the second electrode, wherein a distance between the reflective layer and the emission layer is in a range of about 100 nanometers to about 160 nanometers.

A thickness of the first charge auxiliary layer may be in a range of about 100 nanometers to about 160 nanometers.

A total thickness of the optical functional layer and the first charge auxiliary layer may be in a range of about 120 nanometers to about 240 nanometers.

The electronic device may further include a second charge auxiliary layer between the emission layer and the second electrode, wherein the second charge auxiliary layer may include inorganic nanoparticles.

A refractive index of the second charge auxiliary layer may be less than a refractive index of the emission layer, and a difference between the refractive index of the emission layer and the refractive index of the second charge auxiliary layer may be greater than or equal to 0.20.

The second charge auxiliary layer may include zinc-containing oxide nanoparticles represented by $Zn_{1-x}Q_xO$ (wherein, Q is Mg, Co, Ni, Ga, Al, Ca, Zr, W, Li, Ti, Ta, Sn, Hf, Si, Ba, or a combination thereof, and $0 \leq x < 0.5$). A total thickness of the first charge auxiliary layer, the emission layer, and the second charge auxiliary layer may be in a range of about 160 nm to about 230 nanometers.

A full width at half maximum of wavelength spectrum of color displayed by the electronic device may be narrower than a full width at half maximum of emission spectrum of the emission layer.

According to one embodiment, an electronic device includes a first electrode including a reflective layer, a first charge auxiliary layer on the first electrode, the first charge auxiliary layer including a hole transport layer, a hole injection layer, or a combination thereof, an emission layer on the first charge auxiliary layer, the emission layer including a quantum dot configured to emit a light in a red wavelength region, a second electrode on the emission layer, and an optical functional layer on the second electrode, wherein a distance between the reflective layer and the emission layer is in a range of about 30 nm to about 80 nanometers or about 230 nanometers to about 280 nanometers.

A thickness of the first charge auxiliary layer may be in a range of about 30 nanometers to about 80 nanometers or about 230 nanometers to 280 nanometers.

A total thickness of the optical functional layer and the first charge auxiliary layer may be in a range of about 40 nanometers to about 170 nanometers or about 240 nanometers to 370 nanometers.

The electronic device may further include a second charge auxiliary layer between the emission layer and the second electrode, wherein the second charge auxiliary layer may include inorganic nanoparticles.

A refractive index of the second charge auxiliary layer may be less than a refractive index of the emission layer, and a difference between the refractive index of the emission layer and the refractive index of the second charge auxiliary layer may be greater than or equal to about 0.20.

The second charge auxiliary layer may include zinc-containing oxide nanoparticles represented by $Zn_{1-x}Q_xO$ (wherein, Q is Mg, Co, Ni, Ga, Al, Ca, Zr, W, Li, Ti, Ta, Sn, Hf, Si, Ba, or a combination thereof, and $0 \leq x < 0.5$).

A total thickness of the first charge auxiliary layer, the emission layer, and the second charge auxiliary layer may be in a range of about 75 nanometers to about 135 nanometers or about 270 nanometers to 330 nanometers.

A full width at half maximum of wavelength spectrum of color displayed by the electronic device may be narrower than a full width at half maximum of emission spectrum of the emission layer.

According to an embodiment, a display device includes the electronic device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
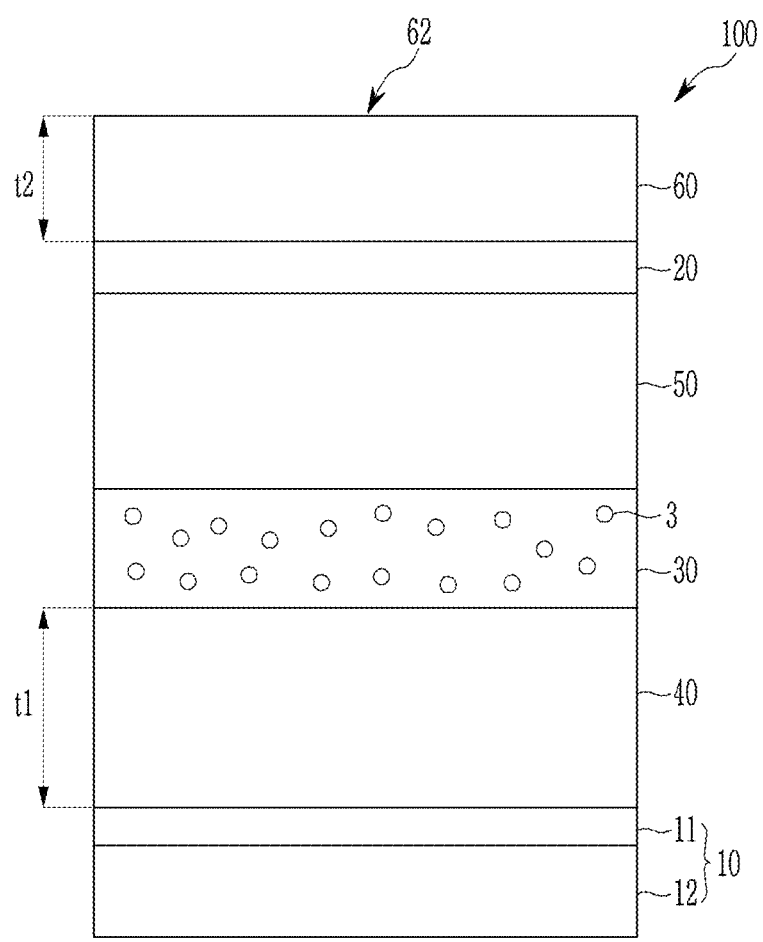
FIG. 1 is a schematic cross-sectional view of an electronic device according to an embodiment.

Embodiments of the present disclosure will hereinafter be described in detail with reference to the accompanying drawings, in which various embodiments are shown. However, this disclosure may be embodied in many different forms, and is not to be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic cross-sectional view of an electronic device 100 according to an embodiment.

An electronic device 100 according to an embodiment includes a first electrode 10 and a second electrode 20 facing each other, an emission layer 30 including a plurality of quantum dots 3, wherein the emission layer is disposed between the first electrode 10 and the second electrode 20, a first charge auxiliary layer 40 disposed between the first electrode 10 and the emission layer 30, a second charge auxiliary layer 50 disposed between the emission layer 30 and the second electrode 20, and an optical functional layer 60 disposed on the second electrode 20 on a side opposite the emission layer 30. That is, the optical functional layer 60 and the emission layer 30 are on opposite sides of the second electrode 20. In an embodiment, the electronic device 100 does not include the second charge auxiliary layer 50.

The electronic device 100 may be an electro-luminescence device capable of generating light by flowing current to the emission layer 30 including the plurality of quantum dots 3 through the first electrode 10 and the second electrode 20. The electronic device 100 may generate light in a variety of wavelength regions depending upon the types of quantum dots in the plurality of quantum dots 3 included in the emission layer 30.

In an embodiment, as the first electrode 10 may be a reflecting electrode including a reflective layer, and the second electrode 20 may be a light-transmitting electrode. In the electronic device 100, the light generated from the emission layer 30 may be emitted to the outside of the electronic device 100 through the upper side 62 of the optical functional layer 60 as shown in FIG. 1.

Even though not shown in FIG. 1, the first electrode 10 may be disposed directly on a suitable substrate. As the first electrode 10 includes a material having a high reflectivity, it may reflect incident light that reaches to the first electrode 10.

In an embodiment, the first electrode 10 may act as a cathode. The first electrode 10 is paired with the second electrode 20 acting as an anode to flow a current through the emission layer 30.

In an embodiment, the first electrode 10 may act as an anode. The first electrode 10 is paired with the second electrode 20 acting as a cathode to flow a current through the emission layer 30.

In an embodiment, the first electrode 10 may include a first layer 11 having a work function of about 4.2 electron volts (eV) to about 4.7 eV, and an optically opaque second layer 12. In an embodiment, the first layer 11 of the first electrode 10 has a work function of about 4.2 eV to about 4.6 eV, about 4.2 eV to about 4.5 eV, about 4.2 eV to about 4.4 eV, about 4.3 eV to about 4.7 eV, about 4.4 eV to about 4.7 eV, or about 4.5 eV to about 4.7 eV.

The first layer 11 may be directly connected to a driving power source so may function to flow current to the emission layer 30. The first layer 11 may be formed on the second layer 12 with reference to FIG. 1. The first layer 11 may be an optically transparent conductive material. Thereby, a portion of the light generated from the emission layer 30 may be passed through the first layer 11 and entered to the second layer 12. In an embodiment, the first layer 11 may include an indium (In)-tin (Sn) oxide, an indium (In)-zinc (Zn) oxide, magnesium (Mg)-silver (Ag), aluminum (Al)-lithium (Li), magnesium (Mg)-indium (In), an indium (In) oxide, a tin (Sn) oxide, a gallium (Ga) oxide, a zinc (Zn) oxide, or a combination thereof, and the second layer 12 may include silver (Ag), aluminum (Al), zinc (Zn), gold (Au), iridium (Ir), copper (Cu), platinum (Pt), or a combination thereof.

The second layer 12 may be a reflective layer including or made of a metal having a high reflectivity. In an embodiment, the second layer 12 may include silver (Ag), aluminum (Al), zinc (Zn), gold (Au), iridium (Ir), copper (Cu), platinum (Pt), or a combination thereof. Thereby, the light generated from the emission layer 30 is entered into the first layer 11 to an interface between the first layer 11 and the second layer 12, and reflected and returned to the emission layer 30. In other words, the second layer 12 may function as the reflecting electrode.

If the second layer 12 is directly connected to a driving power source so may function to flow current to the emission layer 30, the first layer 11 may be omitted.

The first electrode 10 may further include a third layer (not shown). The third layer may be formed under the second layer 12 with reference to FIG. 1, but is not limited thereto. The third layer may include an indium (In)-tin (Sn) oxide, an indium (In)-zinc (Zn) oxide, magnesium (Mg)-silver (Ag), aluminum (Al)-lithium (Li), magnesium (Mg)-indium (In), an indium (In) oxide, a tin (Sn) oxide, a gallium (Ga) oxide, a zinc (Zn) oxide, or a combination thereof, and the second layer 12 may include silver (Ag), aluminum (Al), zinc (Zn), gold (Au), iridium (Ir), copper (Cu), platinum (Pt), or a combination thereof, but is not limited thereto.

The second electrode 20 may be an optically transparent material, so it may act as a light-transmitting electrode so that the light generated from the emission layer 30 may be transmitted through the second electrode 20. In an embodiment, the second electrode 20 may include lithium, magnesium, aluminum, aluminum-lithium, calcium, magnesium-indium, magnesium-silver, or a combination thereof.

The emission layer 30 may include a plurality of quantum dots 3. The emission layer 30 may be formed by coating a resin into which the plurality of quantum dots 3 is dispersed, and curing the same.

The emission layer 30 is where the electrons and holes are delivered by the current supplied by the first electrode 10 and the second electrode 20. The electrons and holes recombine in the emission layer 30 to generate an exciton, and the generated exciton may be configured to emit light, at a wavelength corresponding to the size of the quantum dots in the plurality of quantum dots 3, while being transited from an excited state to a ground state.

As quantum dots 3 have a discontinuous energy bandgap by the quantum confinement effect, it may be configured to convert the incident light to light at a predetermined wavelength and emit the same. Thereby, the emission layer 30 including the plurality of quantum dots 3 may generate light having excellent color reproducibility and color purity. For example, the light emitted by the plurality of quantum dots 3 may have a narrow full width at half maximum (FWHM).

In an embodiment, the material of the plurality of quantum dots 3 is not particularly limited and includes any suitable quantum dot material, including those which are known in the art and/or commercially available. For example, the quantum dots may include a Group II-VI compound, a Group III-V compound, a Group IV-VI compound, a Group IV compound, a Group compound, a Group I-II-IV-VI compound, or a combination thereof.

For example, the quantum dots may include a Group II-VI compound, a Group III-V compound, a Group IV-VI compound, a Group IV compound, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from a binary element compound selected from GaN, GaP, GaAs, GaSb, AlN, AlP, AlAs, AlSb, InN, InP, InAs, InSb, and a combination thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may be selected from a binary element compound selected from SnS, SnSe, SnTe, PbS, PbSe, PbTe, and a combination thereof; a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

The Group IV compound may include a single-element compound selected from Si, Ge, and a combination thereof; and a binary element compound selected from SiC, SiGe, and a combination thereof.

The binary element compound, the ternary element compound or the quaternary element compound respectively exist in a uniform concentration in the quantum dot particle or in partially different concentrations in the same quantum dot particle. The quantum dots may have a core-shell structure wherein one quantum dot in the plurality of quantum dots 3 surrounds another quantum dot in the plurality of quantum dots 3. The core and shell may each have an interface, and an element of at least one of the core and the shell in the interface may have a concentration gradient wherein the concentration of the element(s) of the shell decreases toward the core. In addition, the plurality of quantum dots 3 may have one core of a quantum dot and multiple shells (i.e., multi-shell) surrounding the core. The multi-shell structure has at least two shells wherein each shell may be a single composition, an alloy, or a shell having a concentration gradient.

In the plurality of quantum dots 3, the quantum dot materials of the shell may have a larger energy bandgap than the bandgap energy of the core, and thereby the quantum dot may exhibit a quantum confinement effect more effectively. In case of a multi-shell type structure, the bandgap of the material of an outer shell may be of higher energy than the bandgap energy of the material of an inner shell that is closer to the core. In this case, the plurality of quantum dots 3 may emit light of a wavelength ranging from ultraviolet (UV) to infrared (IR) light.

The plurality of quantum dots 3 may have quantum efficiency (QE) of greater than or equal to about 10%, for example, greater than or equal to about 30%, greater than or equal to about 50%, greater than or equal to about 60%, greater than or equal to about 70%, or greater than or equal to about 90%.

The quantum dots in the plurality of quantum dots 3 may be formed of the same materials or different materials. In addition, the quantum dots of the plurality of quantum dots 3 may have the same size or a different size from one another.

The plurality of quantum dots 3 has characteristics such as emitting light in all directions. In the emission layer 30 including the plurality of quantum dots 3, it may be difficult to control the transport path of light in one predetermined direction. However, the electronic device 100 according to an embodiment may include a transport path of light so that light is emitted (e.g., directed) to the outside of the electronic device 100 through the second electrode 20 which is a light-transmitting electrode, as the first electrode 10 includes the second layer 12 which is a reflecting electrode.

A thickness of the emission layer 30 may be in range of about 5 nanometers (nm) to about 80 nm, within the ranges, for example about 10 nm to about 80 nm, about 10 nm to about 70 nm, or about 10 nm to about 60 nm.

In an embodiment, the optical functional layer 60 may be formed on the second electrode 20 on a side opposite the emission layer 30. The optical functional layer 60 may include an optically transparent material, but may also function as a transflective layer which passes a portion of light that is at or near the wavelength corresponding to the predetermined resonance wavelength or wavelengths and reflects the remaining portions of light that are emitted from the emission layer. Thus, in an embodiment, a microcavity structure may be formed in a region between the optical functional layer 60 and the first electrode 10 including the reflective layer.

The microcavity structure means that the portion of light at a predetermined wavelength or wavelengths is amplified due to the constructive interference caused by repeatedly reflecting light between a reflecting layer and a transflective layer across an optical length. In the electronic device 100 according to an embodiment, the first electrode 10 may function as a reflecting layer, and the second electrode 20 and/or the optical functional layer 60 may function as a transflective layer. In other words, among the light generated from the emission layer 30, the portion of light near to the wavelength(s) corresponding to the resonance wavelength(s) of the microcavity is reinforced by the second electrode 20 and/or the optical functional layer 60, and the other portion of light at other wavelengths are suppressed.

Thus, the electronic device 100 in which the microcavity is formed by the second electrode 20 and/or the optical functional layer 60 and the first electrode 10, for example, may amplify the portion of light corresponding to the objective wavelength range within the visible light wavelength range and emit the same to the outside.

The wavelength range of light that is reinforced, for example amplified, by the microcavity may be determined by the physical properties of the materials in the electronic device 100, the optical properties of the transflective layer, an optical length between the transflective layer and the reflecting layer, and the like. More specifically, the properties of the microcavity of the electronic device 100 according to an embodiment may be preliminarily determined in part by a refractive index of the optical functional layer 60 which is a transflective layer. The optical functional layer 60 is not totally reflective at least at the interface with the second electrode 20, so the refractive index of the optical functional layer 60 may be the same as the refractive index of the second electrode 20, or the refractive index of the optical functional layer 60 may be greater than the refractive index of the second electrode 20.

Meanwhile, the optical functional layer 60 according to an embodiment may have a refractive index of, for example, greater than or equal to about 1.2, for example, greater than or equal to about 1.5, for example, greater than or equal to about 1.7, for example, greater than or equal to about 2.2, and the refractive index may be, for example, less than or equal to about 2.8, for example, less than or equal to about 2.6, for example, less than or equal to about 2.5. In an embodiment, the refractive index may be about 1.2 to about 2.8, about 1.5 to about 2.6, about 1.7 to about 2.5, about 2.2 to about 2.8, about 2.2 to about 2.6, or about 2.2 to about 2.5. As optical functional layer 60 has this refractive index, the electronic device 100 according to an embodiment may form a microcavity structure in the region between the optical functional layer 60 and the second layer 12 of the first electrode 10.

In an embodiment, the light wavelength range reinforced, for example amplified, by the microcavity may be also determined by the particular material(s) of the optical functional layer 60 and/or the thickness of the optical functional layer 60, in addition to the refractive index of the optical functional layer 60.

The optical functional layer 60 according to an embodiment may include an organic material including: a triarylamine-based compound including a triarylamine group in which the same or different aryl groups of the three aryl groups are substituted, a diarylamine-based compound including a diarylamine group in which same or different aryl groups of the two aryl groups are substituted, a carbazole-based compound in which the same or different aryl groups of the two aryl groups are substituted in the carbazole structure, or a combination thereof.

In an embodiment, the optical functional layer 60 may have a thickness t2 of, for example, greater than or equal to about 25 nanometers (nm), for example, greater than or equal to about 30 nanometers (nm), for example, greater than or equal to about 35 nm, for example, greater than or equal to about 40 nm, and for example, less than or equal to about 100 nm, for example, less than or equal to about 95 nm, for example, less than or equal to about 90 nm, for example, less than or equal to about 85 nm. In an embodiment, the optical functional layer 60 may have a thickness t2 of about 25 nm to about 80 nm, about 30 nm to about 75 nm, about 30 nm to about 70 nm, about 30 nm to about 65 nm, about 35 nm to about 75 nm, about 35 nm to about 70 nm, about 35 nm to about 65 nm, about 40 nm to about 80 nm, about 40 nm to about 75 nm, about 40 nm to about 70 nm, about 40 nm to about 65 nm, about 45 nm to about 80 nm, about 45 nm to about 75 nm, about 45 nm to about 70 nm, or about 45 nm to about 65 nm.

If the optical functional layer 60 satisfies at least one of the described conditions, it may function as a transflective layer for the predetermined wavelength region within a visible light wavelength region.

In an embodiment, when the emission layer 30 of the electronic device 100 is configured to emit light in a blue wavelength region (a blue light), for example, the optical functional layer 60 may have a thickness of greater than or equal to about 25 nm, for example, greater than or equal to about 30 nm, for example, greater than or equal to about 35 nm, for example, greater than or equal to about 40 nm, and for example, less than or equal to about 100 nm, for example, less than or equal to about 90 nm, for example, less than or equal to about 80 nm, for example, less than or equal to about 70 nm, for example, less than or equal to about 65 nm, for example, less than or equal to about 60 nm, for example, less than or equal to about 55 nm. In an embodiment, the emission layer 30 emits a blue light and the optical functional layer 60 has a thickness of about 30 nm to about 70 nm, about 35 nm to about 65 nm, about 40 nm to about 60 nm, or about 40 nm to about 55 nm.

In an embodiment, when the emission layer 30 of the electronic device 100 is configured to emit light in a red wavelength region (a red light), for example, the optical functional layer 60 may have a thickness of greater than or equal to about 25 nm, for example, greater than or equal to about 30 nm, for example, greater than or equal to about 35 nm, for example, greater than or equal to about 40 nm, for example, greater than or equal to about 65 nm, for example, greater than or equal to about 70 nm, for example, greater than or equal to about 75 nm, and for example, less than or equal to about 100 nm, for example, less than or equal to about 95 nm, for example, less than or equal to about 90 nm, for example, less than or equal to about 85 nm, for example, less than or equal to about 80 nm. In an embodiment, the emission layer 30 emits a red light and the optical functional layer 60 has a thickness of about 65 nm to about 100 nm, about 70 nm to about 95 nm, about 75 nm to about 90 nm, or about 75 nm to about 85 nm.

In an embodiment, the wavelength range of light reinforced, for example amplified, by the microcavity may be determined by an optical length. The optical length corresponds to a distance between the first electrode 10 and the second electrode 20 and/or the optical functional layer 60.

A first charge auxiliary layer 40 and a second charge auxiliary layer 50 are auxiliary layers (FIGS. 1 and 2) for improving the luminous efficiency of the emission layer 30, which function to control the charge carrier balance in the electronic device 100.

In an embodiment, the first charge auxiliary layer 40 and the second charge auxiliary layer 50 may receive a current from the first electrode 10 and the second electrode 20, respectively, and function to transfer the holes and the electrons injected from the first electrode 10 and the second electrode 20 to the emission layer 30, respectively. One of the first charge auxiliary layer 40 and the second charge auxiliary layer 50 may include an electron injecting and/or transporting layer, and the other of the first charge auxiliary layer 40 and the second charge auxiliary layer 50 may include a hole injecting and/or transporting layer.

In an embodiment, the first charge auxiliary layer 40 may include an electron injection layer configured to be injected electrons, an electron transport layer configured to transport electrons to the emission layer 30, or a combination thereof; the second charge auxiliary layer 50 may include a hole injection layer configured to be injected holes, a hole transport layer configured to transport holes to the emission layer 30, or a combination thereof.

In an embodiment, the first charge auxiliary layer 40 may include a hole injection layer configured to be injected holes, a hole transport layer configured to transport holes to the emission layer 30, or a combination thereof; the second charge auxiliary layer 50 may include an electron injection layer configured to be injected electrons, an electron transport layer configured to transport electrons to the emission layer 30, or a combination thereof.

The hole transport layer and/or the hole injection layer may respectively include, for example, at least one selected from poly(3,4-ethylenedioxythiophene):poly(styrene sulfonate) (PEDOT:PSS), poly(9,9-dioctylfluorene-co-N-(4-butylphenyl)diphenylamine) (TFB), polyarylamine, poly (N-vinylcarbazole), polyaniline, polypyrrole, N, N,N',N'-tetrakis(4-methoxyphenyl)-benzidine (TPD), 4-bis[N-(1-naphthyl)-N-phenylamino]biphenyl (α-NPD), 4,4',4"-tris[phenyl(m-tolyl)amino]triphenylamine (m-MTDATA), 4,4', 4"-tris(N-carbazolyl)triphenylamine (TCTA), 1,1-bis[(di-4-tolyl amino)phenyl]cyclohexane (TAPC), and a combination thereof, but are not limited thereto, and may be selected according an energy level inside the electronic device 100.

The electron transport layer and/or the electron injection layer may respectively include inorganic nanoparticles. The inorganic nanoparticles may be for example oxide nanoparticles, for example metal oxide nanoparticles. The inorganic nanoparticles may be 2-dimensional or 3-dimensional nanoparticles having an average diameter of less than or equal to about 10 nm, within the range, for example, less than or equal to about 8 nm, for example, less than or equal to about 7 nm, for example, less than or equal to about 5 nm, for example, less than or equal to about 4 nm, or for example, less than or equal to about 3.5 nm, within the range, for example, about 1 nm to about 10 nm, for example, about 1 nm to about 9 nm, for example, about 1 nm to about 8 nm, for example, about 1 nm to about 7 nm, for example, about 1 nm to about 5 nm, for example, about 1 nm to about 4 nm, or for example, about 1 nm to about 3.5 nm. For example, the inorganic nanoparticles may be metal oxide nanoparticles including at least one of Zn, Mg, Co, Ni, Ga, Al, Ca, Zr, W, Li, Ti, Ta, Sn, Hf and Ba. For example, the inorganic nanoparticles may be metal oxide nanoparticles including zinc, for example, zinc-containing oxide nanoparticles represented by $Zn_{1-x}Q_xO$ ($0 \leq x < 0.5$). Herein, Q may be at least one metal except for Zn, for example, Mg, Co, Ni, Ga, I, Ca, Zr, W, Li, Ti, Ta, Sn, Hf, Si, Ba, or a combination thereof. For example, Q may be Mg. For example, x may satisfy $0 \leq x \leq 0.3$, $0.01 \leq x \leq 0.3$, or $0.01 \leq x \leq 0.2$.

A refractive index of the electron transport layer and/or the electron injection layer may be less than a refractive index of the emission layer, and for example a difference between the refractive index of the emission layer and the refractive index of the electron transport layer and/or the electron injection layer may be greater than or equal to about 0.20. Within the range, a difference between the refractive index of the emission layer and the refractive index of the electron transport layer and/or the electron injection layer may be in range of about 0.20 to about 1.5, for example about 0.20 to about 1.2, for example about 0.20 to about 1.0, for example about 0.20 to about 0.80, for example about 0.20 to about 0.60, or for example about 0.20 to about 0.50. For example, the refractive index of the emission layer 30 may be in range of about 1.7 to about 2.2, and the refractive index of the electron transport layer and/or the electron injection layer may be in range of about 1.5 to about 1.8.

The electronic device 100 according to an embodiment is operated in an inverted type or normal type, and may have a top emission structure emitting light through the second electrode 20 and/or the optical functional layer 60, for example through the upper side 62 of the optical functional layer 60. However, the operating type and the emission structure of the electronic device 100 according to an embodiment are not necessarily limited thereto.

Meanwhile, as described above, an optical length which is one of the conditions for determining the properties of a microcavity. In an embodiment, the optical length corresponds to a distance between a reflective layer and a transflective layer, and it may correspond to a distance between the reflective layer of the first electrode 10 and the second electrode 20 and/or the optical functional layer 60, and thus may be affected by the thickness of the emission layer 30, the thickness of the first charge auxiliary layer 40, and the thickness of the second charge auxiliary layer 50. In an embodiment, in the electronic device 100 the optical length of the microcavity may be determined by the thickness t1 of the first charge auxiliary layer 40, rather than the thickness of the emission layer 30 or the thickness of the second charge auxiliary layer 50.

This is because the electronic device 100 according to an embodiment uses the emission layer 30 including the plurality of quantum dots 3 having isotropically luminous radiating characteristics.

Figure 2:
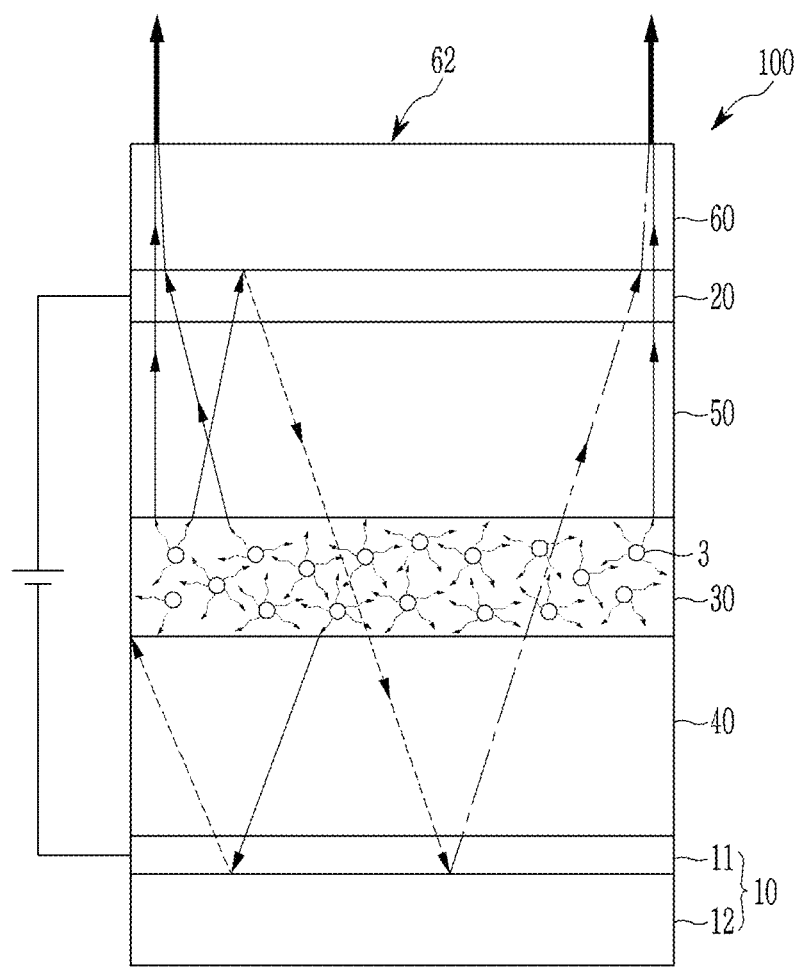
FIG. 2 is a schematic cross-sectional view of a light transport path in an electronic device according to an embodiment.

FIG. 2 is a cross-sectional view schematically showing the various exemplary light transporting paths in the electronic device 100 according to an embodiment.

Referring to FIG. 2, the plurality quantum dots 3 may radiate light in all directions due to the isotropic light radiating characteristics. A part of the light may be transported in a direction 5A to the second layer 12 of the first electrode 10, which is a reflective layer. In addition, a part of the generated light may be transported in a direction 5B to the second electrode 20 and/or the optical functional layer 60 and reflected in a direction 5C towards the second layer 12 of the first electrode 10, and then reflected in a direction 5D from the second layer 12 and transported to the second electrode 20 and/or the optical functional layer 60. The light radiated by the plurality of quantum dots 3 is resonated by repeatedly reflecting between the second layer 12 and the second electrode 20 and/or the optical functional layer 60 in the electronic device 100 and then amplified into light of a predetermined wavelength(s), and this light is ultimately emitted to the outside of the electronic device 100 to display a color corresponding to the predetermined wavelength(s).

Looking to the light transporting paths in FIG. 2, the number of paths passing through between the second layer 12 and the emission layer 30, including the first charge auxiliary layer 40, is greater than the number of paths passing through each of the emission layer 30 and the second charge auxiliary layer 50 according to the repeating resonance pathways. Thereby, the paths of passing light through between the second layer 12 and the emission layer 30, (including the first charge auxiliary layer 40) may determine the optical length of microcavity. That is, according to an embodiment, the optical length of the microcavity is the distance between the second electrode 20 and/or the optical functional layer 60 and the second layer 12 of the first electrode 10, and is measured along the light transporting paths 5C and 5D as shown in FIG. 2.

The first charge auxiliary layer 40 of the electronic device 100 according to an embodiment may be an electron injection layer, an electron transport layer, or a combination thereof, and the first charge auxiliary layer 40 may include a zinc (Zn) oxide, a molybdenum (Mo) oxide, a tungsten (W) oxide, a nickel (Ni) oxide, a zirconium (Zr) oxide, a titanium (Ti) oxide, a nickel (Ni) oxide, a tin (Sn) oxide, or a combination thereof.

In an embodiment, the first charge auxiliary layer 40 may have a thickness t1 of, for example, greater than or equal to about 20 nm, or for example, greater than or equal to about 25 nm, and for example, less than or equal to about 85 nm, for example, less than or equal to about 70 nm, for example, less than or equal to about 65 nm. In an embodiment, the thickness t1 is about 20 nm to about 85 nm, about 25 nm to about 70 nm, or about 25 nm to about 65 nm. By adjusting the material and/or the thickness of the first charge auxiliary layer 40 as describe above, the electronic device 100 according to an embodiment may emit light reinforced by microcavity.

In an embodiment, when the emission layer 30 of the electronic device 100 is configured to emit a red light, the first charge auxiliary layer 40 may have a thickness of, for example, greater than or equal to about 40 nm, for example, greater than or equal to about 45 nm, for example, greater than or equal to about 50 nm, and for example, less than or equal to about 70 nm, for example, less than or equal to about 65 nm. In an embodiment, the emission layer 30 emits a red light and the thickness of the first charge auxiliary layer 40 is about 40 nm to about 70 nm, about 45 nm to about 65 nm, or about 50 nm to about 65 nm.

In an embodiment, when the emission layer 30 of the electronic device 100 is configured to emit a blue light, the first charge auxiliary layer 40 may have a thickness of, for example, greater than or equal to about 20 nm, for example, greater than or equal to about 25 nm, and for example, less than or equal to about 50 nm, for example, less than or equal to about 45 nm, for example, less than or equal to about 40 nm. In an embodiment, the emission layer 30 emits a blue light and the thickness of the first charge auxiliary layer 40 is about 20 nm to about 50 nm, about 25 nm to about 45 nm, or about 25 nm to about 40 nm.

The first charge auxiliary layer 40 of the electronic device 100 according to an embodiment may be a hole injection layer, a hole transport layer, or a combination thereof, and the first charge auxiliary layer 40 may include poly(3,4-ethylenedioxythiophene):poly(styrene sulfonate) (PEDOT:PSS), poly(9,9-dioctylfluorene-co-N-(4-butylphenyl)diphenylamine) (TFB), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenylamino]biphenyl (α-NPD), 4,4',4"-tris[phenyl(m-tolyl) amino]triphenylamine (m-MTDATA), 4,4',4"-tris(N-carbazolyl)triphenylamine (TCTA), 1,1-bis[(di-4-tolyl amino)phenyl]cyclohexane (TAPC), and a combination thereof.

A distance between the second layer 12 and the emission layer 30, including the first charge auxiliary layer 40, may be determined by emission spectrum of the emission layer 30, and thus when the emission layer 30 is configured to emit a blue light, a green light, or a red light, the distance between the second layer 12 and the emission layer 30, including the first charge auxiliary layer 40, may be different from each other.

In an embodiment, when the emission layer 30 of the electronic device 100 is configured to emit a blue light, the distance between the second layer 12 and the emission layer 30 may be designed to have a resonant wavelength within a blue wavelength region. In an embodiment, when the emission layer 30 of the electronic device 100 is configured to emit a green light, the distance between the second layer 12 and the emission layer 30 may be designed to have a resonant wavelength within a green wavelength region. In an embodiment, when the emission layer 30 of the electronic device 100 is configured to emit a red light, the distance between the second layer 12 and the emission layer 30 may be designed to have a resonant wavelength within a red wavelength region. The resonant wavelength may be one or two or more.

In an embodiment, when the emission layer 30 of the electronic device 100 is configured to emit a blue light, the distance between the second layer 12 and the emission layer 30 may be in range of about 100 nm to about 160 nm. For example, when the first layer 11 of the first electrode 10 is omitted or a thickness of the first layer 11 is very thin, the distance between the second layer 12 and the emission layer 30 may be substantially same as a thickness of the first charge auxiliary layer 40, and thus the thickness of the first charge auxiliary layer 40 may be in range of about 100 nm to about 160 nm.

In an embodiment, when the emission layer 30 of the electronic device 100 is configured to emit a red light, the distance between the second layer 12 and the emission layer 30 configure to emit a red light may be smaller or larger than the distance between the second layer 12 and the emission layer 30 configured to emit a blue light, for example, the distance between the second layer 12 and the emission layer 30 configure to emit a red light may be about 0.1 to about 0.9 times or about 1.2 times to about 3 times the distance between the second layer 12 and the emission layer 30 configured to emit a blue light.

In an embodiment, when the emission layer 30 of the electronic device 100 is configured to emit a red light, the distance between the second layer 12 and the emission layer 30 may be in range of about 30 nm to about 80 nm or about 230 nm to about 280 nm. When the first layer 11 of the first electrode 10 is omitted or a thickness of the first layer 11 is very thin, the distance between the second layer 12 and the emission layer 30 may be substantially same as a thickness of the first charge auxiliary layer 40, and thus the thickness of the first charge auxiliary layer 40 may be in range of about 30 nm to about 80 nm or about 230 nm to about 280 nm.

In an embodiment, when the emission layer 30 of the electronic device 100 is configured to emit a green light, the distance between the second layer 12 and the emission layer 30 configured to emit a green light may be smaller or larger than the distance between the second layer 12 and the emission layer 30 configured to emit a blue light or the distance between the second layer 12 and the emission layer 30 configured to emit a red light, for example, the distance between the second layer 12 and the emission layer 30 configured to emit a green light may be about 0.1 to about 0.9 times or about 1.2 times to about 3 times the distance between the second layer 12 and the emission layer 30 configured to emit a blue light or the distance between the second layer 12 and the emission layer 30 configured to emit a red light. When the first layer 11 of the first electrode 10 is omitted or a thickness of the first layer 11 is very thin, the distance between the second layer 12 and the emission layer 30 may be substantially same as a thickness of the first charge auxiliary layer 40.

Meanwhile, a thickness of the second charge auxiliary layer 50 may be in a range of about 5 nm to about 100 nm, within the range, for example, about 10 nm to about 100 nm, about 10 nm to about 80 nm, or about 10 nm to about 60 nm.

When the emission layer 30 including the plurality of quantum dots 3 is applied to an electro-luminescence structure, unlike the general organic light emitting diode, the electronic device 100 has a very low light extraction efficiency of about 25% due to the isotropically luminous radiating characteristics of the plurality of quantum dots 3. In addition, as the organic light emitting diode may readily control the balance of the charge carrier by adjusting the inner elements of the device, it can provide a microcavity, but in a case of the quantum dot electro-luminescence device including the plurality of quantum dots 3, it is difficult to variously design the balance of the charge carrier by adjusting only the inner elements of the electronic device, so that the forming of a microcavity is more difficult.

However, the electronic device 100 according to an embodiment includes the optical functional layer 60, which is a transflective layer, disposed on the inside of the electronic device 100, so that a microcavity is formed in the quantum dot electro-luminescence device, and also the wavelength region of the microcavity may be further controlled by adjusting the thickness of the first charge auxiliary layer 40. Accordingly, the electronic device 100 according to an embodiment may have an excellent luminous efficiency since both the external quantum efficiency (EQE) and the light extraction efficiency are improved.

In addition, the electronic device according to an embodiment may be configured to emit light having a narrower full width at half maximum (FWHM) and a less distortion of conduction band due to the defects, than the organic light emitting diode, so the emitted light may have a high color reproducibility and a high color purity.

In an embodiment, a color purity of a color displayed by the electronic device 100 according to an embodiment may be higher than a color purity of light emitted by the emission layer 30, and thus a FWHM of wavelength spectrum of color displayed by the electronic device 100 may be narrower than a FWHM of emission spectrum of the emission layer 30. Herein, the FWHM of emission spectrum of the emission layer 30 may be confirmed from an electronic device not having a microcavity structure.

In an embodiment, the FWHM of wavelength spectrum of color displayed by the electronic device 100 may be about 0.2 times to about 0.9 times, about 0.2 times to about 0.8 times, about 0.2 times to about 0.7 times, about 0.2 times to about 0.6 times, or about 0.2 times to about 0.5 times the FWHM of emission spectrum of the emission layer 30. In an embodiment, the FWHM of emission spectrum of the emission layer 30 may be in a range of about 20 nm to about 50 nm, and the FWHM of wavelength spectrum of color displayed by the electronic device 100 may be in a range of about 7 nm to about 40 nm.

Hereinafter, a display device 1000 including an electronic device according to an embodiment is described with reference to FIG. 3.

Figure 3:
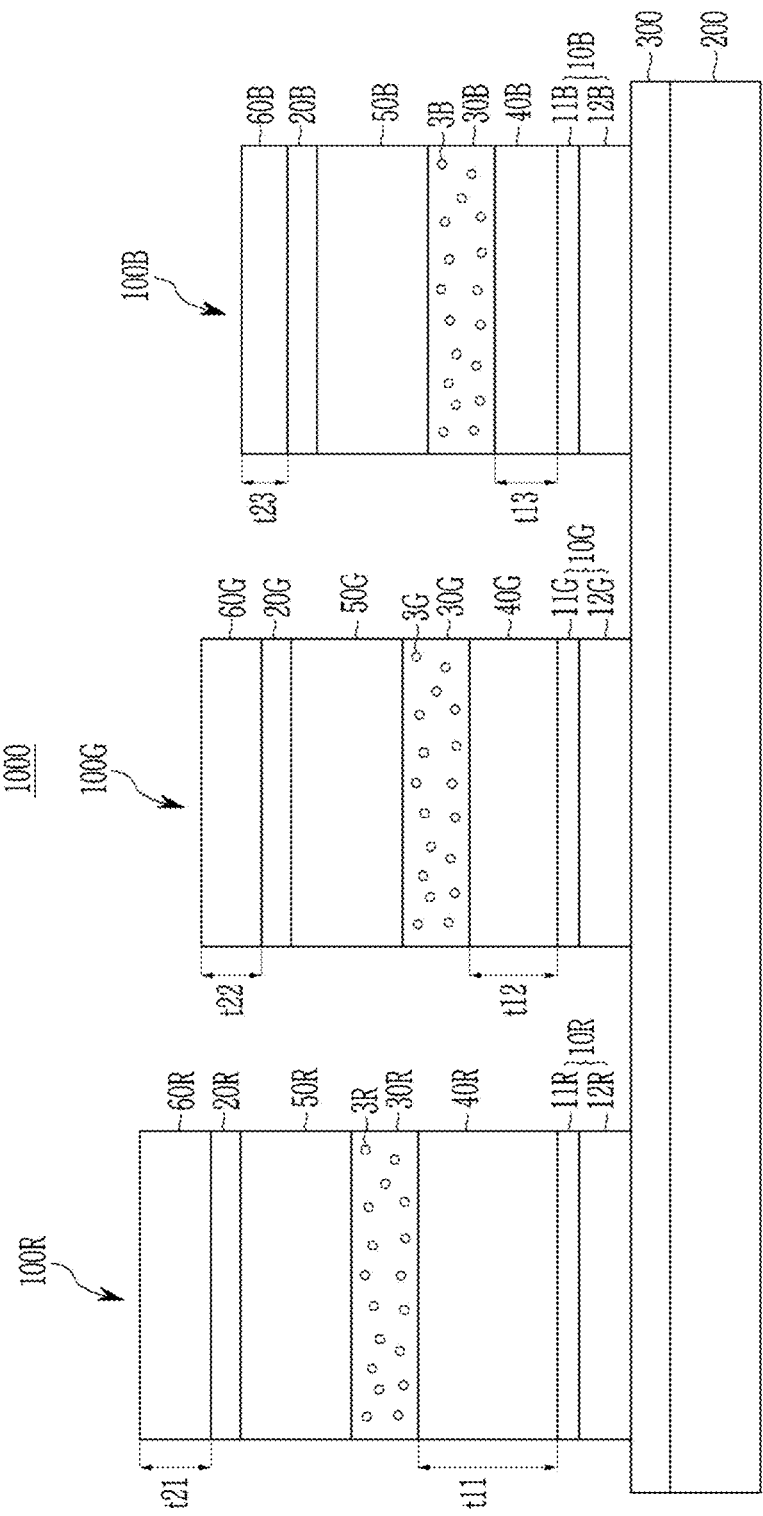
FIG. 3 is a schematic cross-sectional view of a display device including an electronic device according to an embodiment.

FIG. 3 is a schematic cross-sectional view of a display device including an electronic device according to an embodiment.

The display device 1000 according to an embodiment includes a substrate 200, a driving circuit 300 formed on the substrate 200, and a first electronic device 100R, a second electronic device 100G, and a third electronic device 100B spaced apart from each other in a predetermined interval and disposed on the driving circuit 300.

The first to third electronic devices 100R, 100G, and 100B have the same structure as in the electronic device 100, but the wavelength regions of the lights emitted from each of the plurality of quantum dots 3R, 3G, and 3B are different from each other.

In an embodiment, the first electronic device 100R is a red device emitting a red light, the second electronic device 100G is a green device emitting a green light, and the third electronic device 100B is a blue device emitting a blue light. In other words, the first to third electronic devices 100R, 100G, 100B may be pixels expressing red, green, and blue, respectively, in the display device 1000.

However, an embodiment is not necessarily limited thereto, but the first to third electronic devices may respectively express magenta, yellow, cyan, or may express other colors.

The substrate 200, which is a transparent insulation substrate, may be a soft material. The substrate 200 may include glass or a polymer material in a film having a glass transition temperature (Tg) of greater than about 150° C. For example, it can include a COC (cycloolefin copolymer) or a COP (cycloolefin polymer) based material.

The driving circuit 300 is disposed on the substrate 200 and independently connected with each of the first to third electronic devices 100R, 100G, and 100B. The driving circuit 300 may include at least one line including a scan line, a data line, a driving power source line, a common power source line, and the like, at least two of thin film transistors (TFT) connected to the wire and corresponding to one organic light emitting diode, and at least one capacitor, or the like. The driving circuit 300 may have a variety of suitable structures, including the known structures in the art.

According to an embodiment, each of the first to third electronic devices 100R, 100G, and 100B may each independently have a refractive index of, for example, greater than or equal to about 1.2, for example, greater than or equal to about 1.5, for example, greater than or equal to about 1.7, for example, greater than or equal to about 2.2, and the refractive index may be, for example, less than or equal to about 2.8, for example, less than or equal to about 2.6, for example, less than or equal to about 2.5. In an embodiment, the first to third electronic devices 100R, 100G, and 100B may each independently have a refractive index of about 1.2 to about 2.8, about 1.5 to about 2.6, about 1.7 to about 2.5, or about 2.2 to about 2.5. As all the optical functional layers 60R, 60G, and 60B of each device have the refractive index, the devices may form each microcavity through the optical functional layer 60R, 60G, and 60B and the second layers 12R, 12G, and 12B.

In an embodiment, as lights emitted from each of the first to third electronic devices 100R, 100G, and 100B have different wavelength regions, the thickness of the optical functional layer 60R, 60G, and 60B, the thickness of the first charge auxiliary layer 40R, 40G, and 40B, and/or the thickness of the second charge auxiliary layer 50R, 50G, and 50B may be different from each other. The thickness of the emission layer 30R, 30G, and 30B may be the same or different from each other.

In an embodiment, the distances between the second layer 12 and the emission layer 30 of each of the electronic devices 100R, 100G, and 100B may be determined by the emission spectra of the emission layer 30R, 30G, and 30B. For example, as the emission layer 30R of the first electronic device 100R is configured to emit a red light, the distance between the second layer 12R and the emission layer 30R of the first electronic device 100R may be designed to have a resonant wavelength within a red wavelength region. For example, as the emission layer 30G of the second electronic device 100G is configured to emit a green light, the distance between the second layer 12G and the emission layer 30G of the second electronic device 100G may be designed to have a resonant wavelength within a green wavelength region. For example, as the emission layer 30B of the third electronic device 100B is configured to emit a blue light, the distance between the second layer 12B and the emission layer 30B of the third electronic device 100B may be designed to have a resonant wavelength within a blue wavelength region.

For example, the distance between the second layer 12R and the emission layer 30R of the first electronic device 100R may be different from the distance between the second layer 12G and the emission layer 30G of the second electronic device 100G and the distance between the second layer 12B and the emission layer 30B of the third electronic device 100B, respectively.

For example, when the first layers 11R, 11G, 11B of the first to third electronic devices 100R, 100G, 100B are omitted, the first layers 11R, 11G, 11B of the first to third electronic devices 100R, 100G, 100B are very thin, or the thicknesses of the first layers 11R, 11G, 11B of the first to third electronic devices 100R, 100G, 100B are the same, the distance between the second layer 12R, 12G, 12B and the emission layer 30R, 30G, 30B of the electronic device 100R, 100G, 100B may be determined by the thickness of the first charge auxiliary layer 40R, 40G, 40B. For example, the thicknesses of the first charge auxiliary layer 40R, 40G, 40B of the electronic devices 100R, 100G, 100B are different from each other. For example, the thickness t11 of the first charge auxiliary layer 40R of the first electronic device 100R may be greater than, for example thicker than, the thicknesses t12 and t13 of the first charge auxiliary layers 40G and 40B of the second and third electronic devices 100G and 100B. In addition, the thickness t13 of the first charge auxiliary layer 40B of the third electronic device 100B may be less than, for example thinner than, the thickness t12 of the charge auxiliary layer 40G of the second electronic device 100G.

In an embodiment, when the first charge auxiliary layer 40R of the first electronic device 100R is an electron injection layer, an electron transport layer, or a combination thereof, the thickness t11 of the first charge auxiliary layer 40R of the first electronic device 100R may be, for example, greater than or equal to about 40 nm, for example, greater than or equal to about 45 nm, for example, greater than or equal to about 50 nm, and for example, less than or equal to about 70 nm, for example, less than or equal to about 65 nm.

In an embodiment, when the first charge auxiliary layer 40B of the third electronic device 100B is an electron injection layer, an electron transport layer, or a combination thereof, the thickness t11 may be for example, greater than or equal to about 20 nm, for example, greater than or equal to about 25 nm, and for example, less than or equal to about 50 nm, for example, less than or equal to about 45 nm, for example, less than or equal to about 40 nm.

In an embodiment, when the first charge auxiliary layer 40B of the third electronic device 100B is a hole injection layer, a hole transport layer, or a combination thereof, the thickness t13 of the first charge auxiliary layer 40B may be for example about 100 nm to about 160 nm. Within the range, the thickness t13 of the first charge auxiliary layer 40B may be for example about 100 nm to about 150 nm, for example about 100 nm to about 140 nm, for example about 110 nm to about 150 nm, for example about 110 nm to about 140 nm or for example about 120 nm to about 140 nm.

In an embodiment, when the first charge auxiliary layer 40R of the first electronic device 100R is a hole injection layer, a hole transport layer, or a combination thereof, the first charge auxiliary layer 40R may be thicker than or thinner than the first charge auxiliary layer 40B, and for example the thickness t11 of the first charge auxiliary layer 40R of the first electronic device 100R may be about 0.1 times to about 0.9 times or about 1.2 time to about 3 times the thickness t13 of the first charge auxiliary layer 40B of the third electronic device 100B. For example, the thickness t11 of the first charge auxiliary layer 40R of the first electronic device 100R may be about 30 nm to about 80 nm or about 230 nm to about 280 nm.

In an embodiment, the thicknesses of the second charge auxiliary layers 50R, 50G, 50B of the each of the electronic devices 100R, 100G, 100B may be different from each other, and for example, the thickness of the second charge auxiliary layers 50R of the first electronic devices 100R may be different from the thicknesses of the second charge auxiliary layers 50G, 50B of the second or third electronic devices 100G and 100B. For example, the thickness of the second charge auxiliary layers 50R of the first electronic devices 100R may be greater than the thickness of the second charge auxiliary layers 50B of the third electronic device 100B.

Accordingly, a total thickness of the first charge auxiliary layer 40R, 40G, 40B, the emission layer 30R, 30G, 30B, and the second charge auxiliary layer 50R, 50G, 50B of the first to third electronic devices 100R, 100G, 100B may be different from each other. For example, a total thickness of the first charge auxiliary layer 40R, the emission layer 30R, and the second charge auxiliary layer 50R of the first electronic device 100R may be in range of about 75 nm to about 135 nm or about 270 nm to about 330 nm. For example, a total thickness of the first charge auxiliary layer 40B, the emission layer 30B, and the second charge auxiliary layer 50B of the third electronic device 100B may be in range of about 160 nm to about 230 nm. In an embodiment, the thicknesses of the optical functional layers 60R, 60G, 60B of the electronic devices 100R, 100G, 100B may be the same or different from each other. For example, the thickness t21 of the optical functional layer 60R of the first electronic device 100R may be greater than, for example thicker than, the thicknesses t22 and t23 of the optical functional layers 60G and 60B of the second and third electronic devices 100G and 100B. In addition, the thickness t23 of the optical functional layer 60B of the third electronic device may be less than, for example thinner than, the thickness t22 of the optical functional layer 60G of the second electronic device 100G.

The optical functional layer 60R of the first electronic device 100R may have a thickness t21 of, for example, greater than or equal to about 25 nm, for example, greater than or equal to about 30 nm, for example, greater than or equal to about 35 nm, for example, greater than or equal to about 40 nm, for example, greater than or equal to about 45 nm, for example, greater than or equal to about 50 nm, for example, greater than or equal to about 55 nm, for example, greater than or equal to about 60 nm, for example, greater than or equal to about 65 nm, for example, greater than or equal to about 70 nm, for example, greater than or equal to about 75 nm, and for example, less than or equal to about 100 nm, for example, less than or equal to about 95 nm, for example, less than or equal to about 90 nm, for example, less than or equal to about 85 nm, for example, less than or equal to about 80 nm. In an embodiment, the thickness t21 can be about 25 nm to about 100 nm, about 30 nm to about 100 nm, about 35 nm to about 100 nm, about 40 nm to about 100 nm, about 45 nm to about 100 nm, about 55 nm to about 100 nm, about 60 nm to about 100 nm, about 65 nm to about 100 nm, about 70 nm to about 95 nm, about 75 nm to about 90 nm, or about 75 nm to about 85 nm.

In an example, the optical functional layer 60B of the third electronic device 100B may have a thickness t23 of, for example, greater than or equal to about 25 nm, for example, greater than or equal to about 30 nm, for example, greater than or equal to about 35 nm, for example, greater than or equal to about 40 nm, and for example, less than or equal to about 70 nm, for example, less than or equal to about 65 nm, for example, less than or equal to about 60 nm, for example, less than or equal to about 55 nm. In an embodiment, the thickness t23 can be about 25 nm to about 70 nm, about 30 nm to about 70 nm, about 35 nm to about 65 nm, about 40 nm to about 60 nm, or about 40 nm to about 55 nm.

For example, the thicknesses of the optical functional layers 60R, 60G, 60B of the electronic devices 100R, 100G, 100B may be the same. For example, the thicknesses of the optical functional layers 60R, 60G, 60B of the electronic devices 100R, 100G, 100B may be independently in range of about 20 nm to about 80 nm, within the range, for example, about 25 nm to about 80 nm, for example, about 30 nm to about 75 nm, for example, about 30 nm to about 70 nm, for example, about 30 nm to about 65 nm, for example, about 35 nm to about 75 nm, for example, about 35 nm to about 70 nm, for example, about 35 nm to about 65 nm, for example, about 40 nm to about 80 nm, for example, about 40 nm to about 75 nm, for example, about 40 nm to about 70 nm, for example, about 40 nm to about 65 nm, for example, about 45 nm to about 80 nm, for example, about 45 nm to about 75 nm, for example, about 45 nm to about 70 nm, for example, about 45 nm to about 65 nm.

For example, the total thickness of the optical functional layer 60R and the first charge auxiliary layer 40R of the first electronic device 100R may be in a range of about 40 nm to about 170 nm, for example, about 50 nm to about 160 nm, for example, about 60 nm to 150 nm. For example, the total thickness of the optical functional layer 60R and the first charge auxiliary layer 40R of the first electronic device 100R may be in a range of about 240 nm to about 370 nm, for example, about 250 nm to about 360 nm, for example, about 260 nm to 350 nm.

For example, the total thickness of the optical functional layer 60B and the first charge auxiliary layer 40B of the third electronic device 100B may be in a range of about 120 nm to about 240 nm, for example, about 120 nm to about 230 nm, for example, about 120 nm to 220 nm.

By providing different thicknesses of optical functional layers 60R, 60G, and 60B, different thicknesses of first charge auxiliary layers 40R, 40G, and 40B, and/or different thicknesses of second charge auxiliary layers 50R, 50G, and 50B that correspond to the wavelength of each microcavity of the first to third electronic devices 100R, 100G, and 100B, the first to third electronic devices 100R, 100G, and 100B may have different heights from each other.

However, an embodiment is not necessarily limited thereto, but the refractive indexes of the optical functional layers 60R, 60G, and 60B of devices are different from each other, or the first to third electronic devices 100R, 100G, and 100B may have the same height by adjusting the thicknesses of second charge auxiliary layers 50R, 50G, and 50B, emission layers 30R, 30G, and 30B and the like.

As described herein, the display device 1000 according to an embodiment may express images having excellent color purity and color reproducibility through the quantum dot electro-luminescence element. In addition, as each device has excellent luminous efficiency through microcavity, the display device 1000 may express images having a high luminescence in a low power.

Hereinafter, the embodiments are illustrated in more detail with reference to examples. However, these examples are exemplary, and the present disclosure is not limited thereto.

Manufacture of Light Emitting Device I

Example 1

An ITO layer is deposited in a thickness of 10 nm on a silver (Ag) reflector having a thickness of 100 nm, and a ZnO layer is formed thereon in a thickness of 36 nm. Thereafter, blue quantum dots which are dispersed in an organic solvent are coated thereon in a thickness of 25 nm and then cured at 80° C. for 30 minutes under the nitrogen atmosphere to provide a blue emission layer. A 4,4',4"-tris (N-carbazolyl)-triphenylamine (TCTA) layer is formed on the obtained blue emission layer in a thickness of 25 nm, and a $MoO_3$ layer having a thickness of 10 nm and a magnesium-silver layer having a thickness of 12 nm are formed thereon. Then an optical functional layer including at least one of a triarylamine-based compound, a diarylamine-based compound, and a carbazole-based compound is formed on a magnesium-silver layer in a thickness of 51 nm to provide a blue light emitting device according to Example 1.

Example 2

A red light emitting device according to Example 2 is obtained in accordance with the same procedure as in Example 1, except that the ZnO layer is formed in a thickness of 60 nm instead of 36 nm; red quantum dots are dispersed in an organic solvent and coated instead of the blue quantum dots to provide a red emission layer; a carbazole-based compound-including layer is formed in a thickness of 52 nm instead of the TCTA layer; and the optical functional layer is formed in a thickness of 95 nm instead of the thickness of 51 nm.

Example 3

A red light emitting device according to Example 3 is obtained in accordance with the same procedure as in Example 2, except that the ZnO layer is formed in a thickness of 50 nm.

Example 4

A red light emitting device according to Example 4 is obtained in accordance with the same procedure as in Example 2, except that the ZnO layer is formed in a thickness of 55 nm.

Comparative Example 1

A poly(3,4-ethylenedioxythiophene):poly(styrene sulfonate) (PEDOT:PSS) layer having a thickness of 40 nm and a poly(9,9-dioctyl-fluorene-co-N-(4-butylphenyl)-diphenylamine) (TFB) layer having a thickness of 25 nm are formed on an indium tin oxide (ITO) electrode having a thickness of 150 nm. Blue quantum dots dispersed in an organic solvent are coated thereon in a thickness of 25 nm and then cured at 80° C. for 30 minutes under the nitrogen atmosphere to provide a blue emission layer. A ZnO layer having a thickness of 36 nm is formed thereon, and an Al layer is deposited in a thickness of 120 nm to provide a blue light emitting device.

Comparative Example 2

A red light emitting device according to Comparative Example 2 is prepared in accordance with the same procedure as in Comparative Example 1, except that the a carbazole-based compound-including layer is formed in a thickness of 50 nm instead of the TCTA layer as in Example 1; the red quantum dots are coated instead of the blue quantum dots to provide a red emission layer.

Comparative Example 3

A blue light emitting device according to Comparative Example 3 is prepared in accordance with the same procedure as in Example 1, except that CBP [4,4'-bis (9-carbazolyl)-1,1'-biphenyl] layer that Firpic[bis (4,6-difluorophenylpyridinato-N,C2')picolinate indium(III)] is doped is formed in a thickness of 40 nm, instead of forming the blue emission layer including the blue quantum dots.

Evaluation 1: Spectral Radiance According to Wavelength Region of Example 1 and Comparative Example 1

Figure 4:
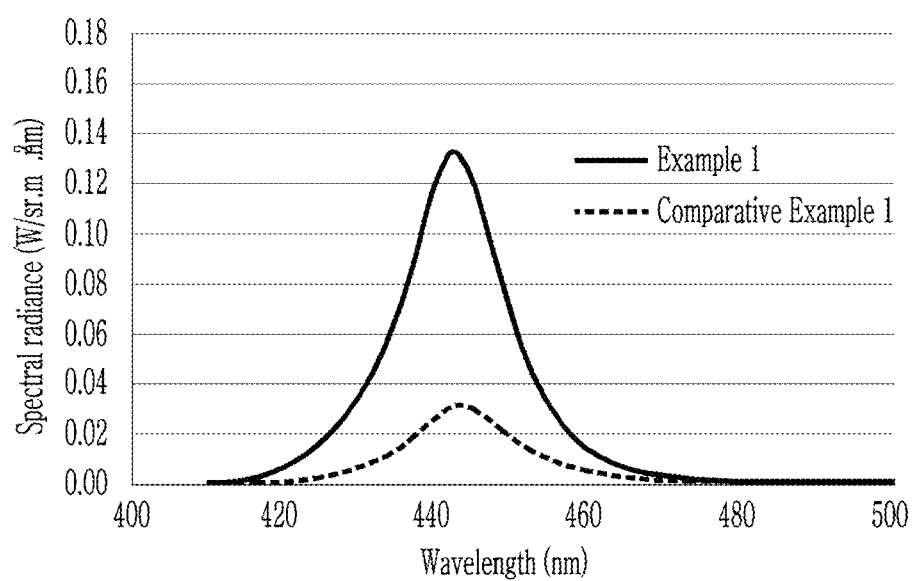
FIG. 4 is a graph of spectral radiance (watt per steradian per square meter per nanometer, $W\ sr^{-1}\ m^{-2}\ nm^{-1}$) versus wavelength (nanometer, nm) showing the spectral radiance according to a wavelength region in Example 1 and Comparative Example 1.

A voltage of 4 V is applied between the silver reflector and the ITO layer according to Example 1 and Comparative Example 1 to operate a light emitting device, and the spectral radiance is measured depending upon a wavelength region of light emitted from each light emitting device, and the results are shown in FIG. 4.

FIG. 4 is a graph showing a spectral radiance according to a wavelength region of Example 1 and Comparative Example 1.

Referring to FIG. 4, it is confirmed that Example 1 has a higher spectral radiance at a blue light wavelength region from about 420 nm to about 480 nm than Comparative Example 1, which is 3.9 times higher at a maximum wavelength ($\lambda_{max}$). In other words, it is confirmed that Example 1 provides a microcavity using the silver (Ag) reflector and the optical functional layer, so as to improve the light extraction efficiency for the blue light wavelength region compared to Comparative Example 1 having no microcavity structure.

Evaluation 2: Spectral Radiance According to Wavelength Region of Example 2 and Comparative Example 2

Figure 5:
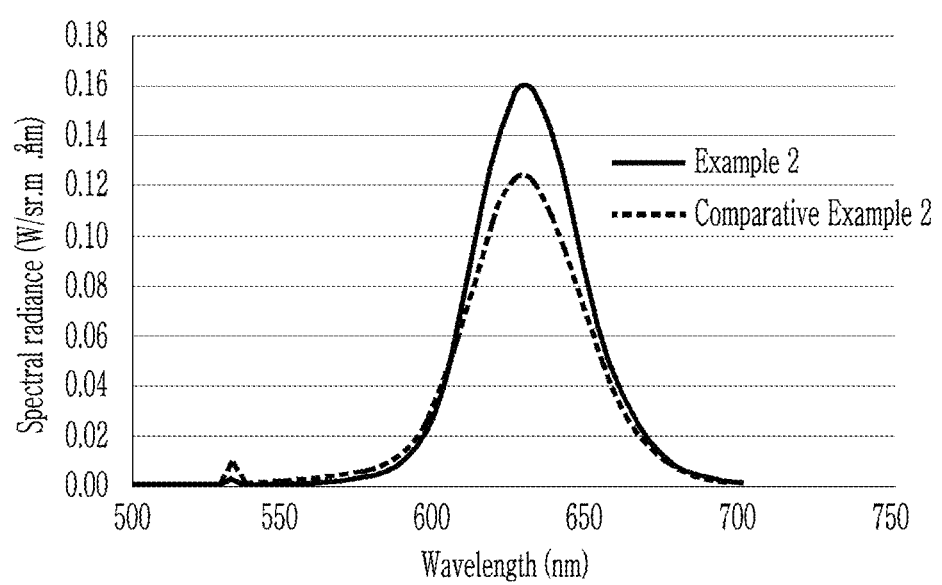
FIG. 5 is a graph of spectral radiance ($W\ sr^{-1}\ m^{-2}\ nm^{-1}$) versus wavelength (nm) showing the spectral radiance according to a wavelength region in Example 2 and Comparative Example 2.

A light emitting device is driven by applying voltage of 4V between the silver reflector and the ITO layer according to Example 2 and Comparative Example 2, and the spectral radiance of light emitted from each light emitting device is measured according to a wavelength region, and the results are shown in FIG. 5.

FIG. 5 is a graph showing a spectral radiance according to a wavelength region of Example 2 and Comparative Example 2.

Referring to FIG. 5, it is confirmed that Example 2 has a higher spectral radiance within a red light wavelength region from about 560 nm to about 700 nm than Comparative Example 2, which is 1.8 times higher at a $\lambda_{max}$. In other words, it is confirmed that Example 2 forms microcavity using the silver (Ag) reflector and the optical functional layer, as in Example 1, so the light extraction efficiency for the red light wavelength region may be improved, compared to Comparative Example 2 having no microcavity.

However, it is understood that the improving effects on the light extraction efficiency for the red light wavelength region is less significant than improving the effect on the light extraction efficiency for the blue light wavelength region. This is estimated because the light extraction of the blue wavelength is insignificantly increased compared to the red wavelength due to the structural characteristics of Example 2 and Comparative Example 2 having a bottom structure of element.

Evaluation 3: Comparison of Spectral Radiance and CIE xy Chromaticity Diagram According to Wavelength Region of Example 1 and Comparative Example 3

Figure 6:
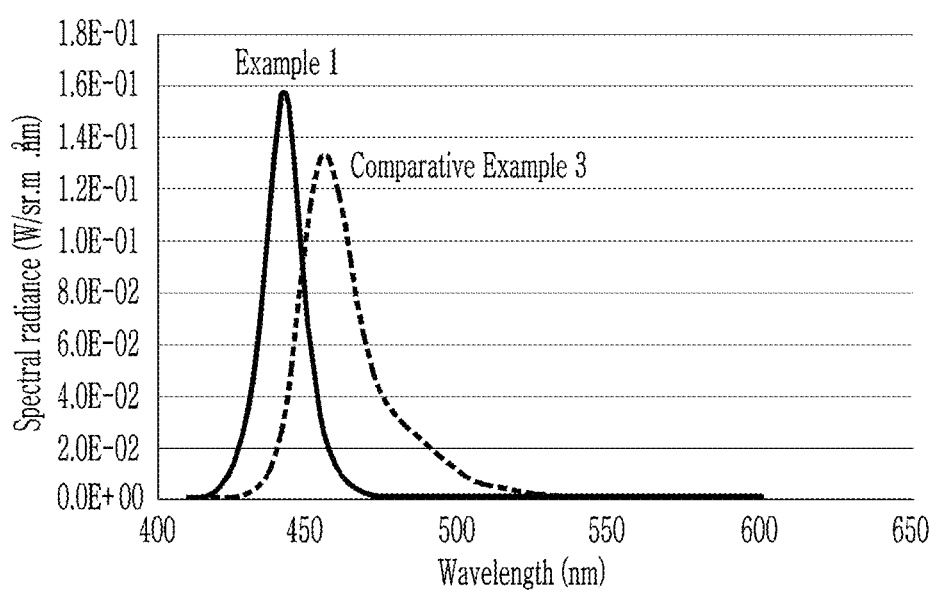
FIG. 6 is a graph of spectral radiance ($W\ sr^{-1}\ m^{-2}\ nm^{-1}$) versus wavelength (nm) showing the spectral radiance according to a wavelength region in Example 1 and Comparative Example 3.

The light emitting device is driven by applying voltage of 4V between the ITO layer and the reflector according to Example 1 and Comparative Example 3, and the spectral radiance of light emitted from each light emitting device is measured according to a wavelength region, and the results are shown in FIG. 6.

Figure 7:
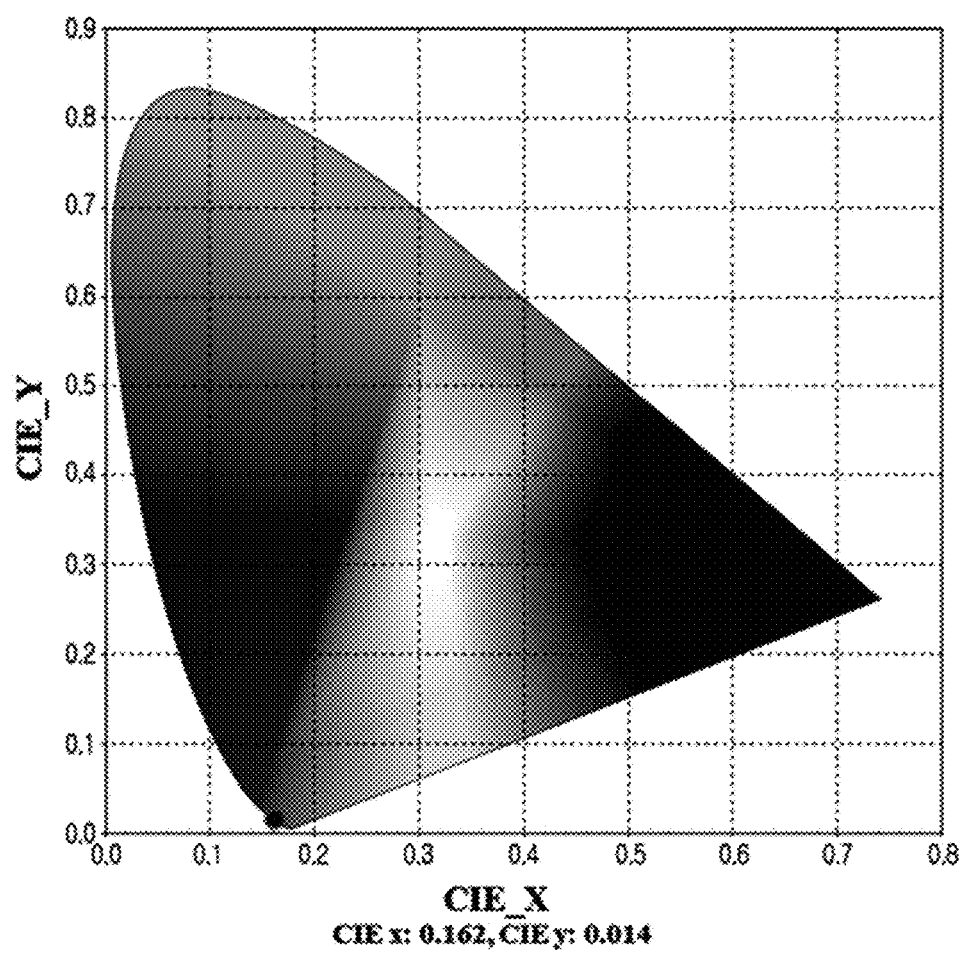
FIGS. 7 and 8 are graphs of CIE (y) versus CIE(x) showing CIE xy chromaticity coordinates for Example 1 and Comparative Example 3, respectively.
Figure 8:
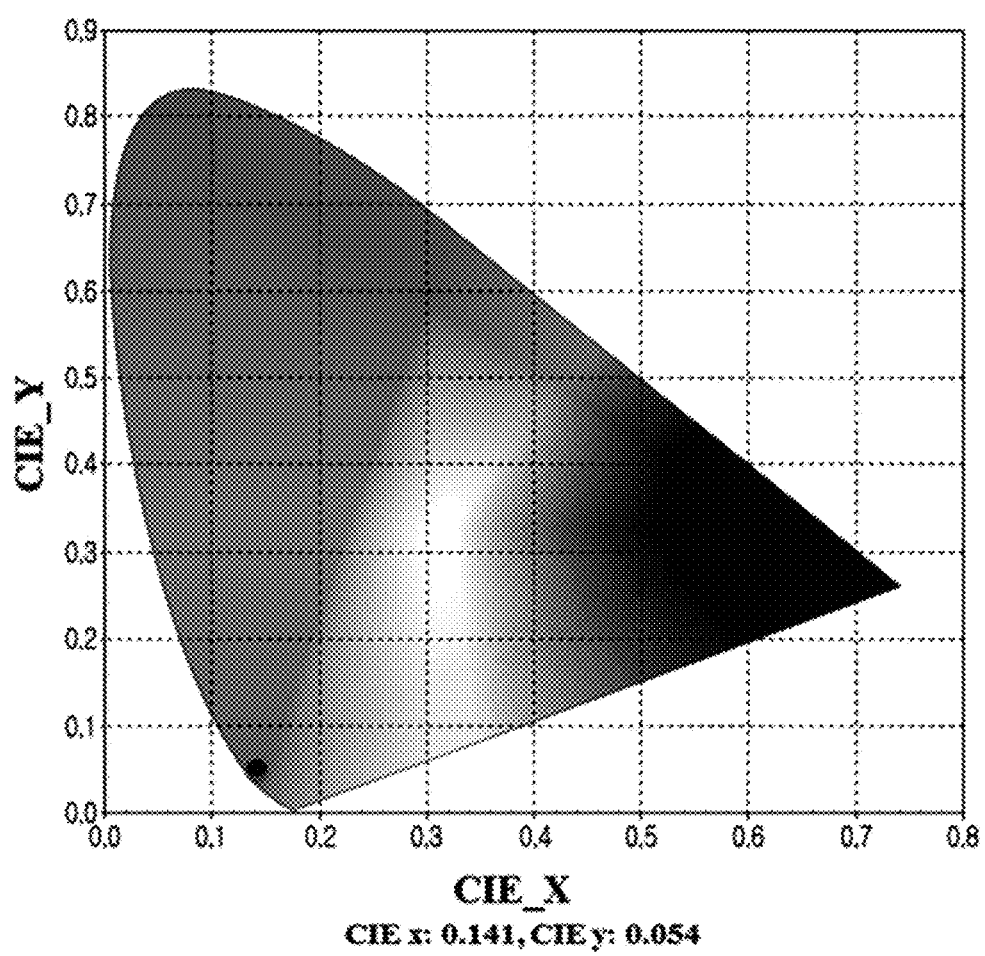

FIG. 6 is a graph showing a spectral radiance of Example 1 and Comparative Example 3 according to a wavelength region; FIG. 7 is a view showing a CIE xy chromaticity diagram for Example 1; and FIG. 8 is for Comparative Example 3.

Referring to FIG. 6, the quantum dot electro-luminescence device according to Example 1 shows a spectral radiance in about 12% higher than in Comparative Example 3 including the general organic light emitting diode, and it shows a full width at half maximum (FWHM) and a central wavelength lower than Comparative Example 3. Particularly, looking at and comparing FIGS. 7 and 8, the quantum dot electro-luminescence device according to Example 1 may emit clearer blue light than the general organic light emitting diode. In other words, the quantum dot electro-luminescence device of Example 1 may emit blue light having higher color reproducibility and color purity than Comparative Example 3.

Evaluation 4: Spectral Radiance According to Wavelength Region of Example 3 and Example 4

Figure 9:
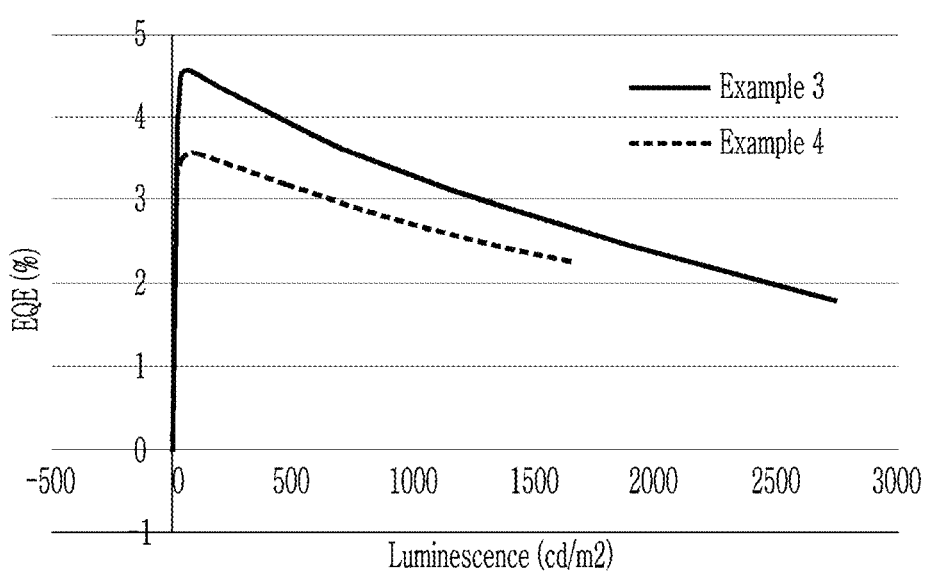
FIG. 9 is a graph of external quantum efficiency (EQE) (%) versus luminance (candela per square meter, $cd/m^2$) showing the change in external quantum efficiency (EQE) according to luminance of Example 3 and Example 4.

The light emitting device is driven by applying voltage of 4 V to 6 V between the ITO layer of the silver reflector according to Example 3 and Example 4, and the spectral radiance according to wavelength region of light emitted from each light emitting device is measured, and the results are shown in FIG. 9.

The vertical axis in FIG. 9 indicates an external quantum efficiency, which is obtained by measuring a current density and a luminescence at the applied voltage and calculating based on the same.

FIG. 9 is a graph showing external quantum efficiency (EQE) according to a luminescence in Example 3 and Example 4.

Referring to FIG. 9, it is confirmed that both Example 3 and Example 4 show quantum efficiency of greater than 3% at a luminescence of near to 0 cd/m². Thereby, in the case of the electronic device formed with microcavity according to an embodiment, it is confirmed that the external quantum efficiency of the electronic device may be changed by only adjusting the thickness of ZnO layer without changing other conditions.

Calculation of Light Extraction Efficiency

The thicknesses of each layer capable of optimizing the light extraction efficiency in the blue light emitting device and the red light emitting device having microcavity structure shown in FIG. 1 are evaluated.

Fresnel coefficient at the interface between adjacent layers using a refractive index (n) of each layer is obtained and the thickness of each layer is calculated to satisfy thin film interference and wide angle interference.

The refractive index is measured from a change in a polarization characteristics (Delta, Psi) using Ellipsometry equipment (J.A.Woollan).

TABLE 1

|  | n(@460 nm) | n(@630 nm) |
| --- | --- | --- |
| Hole Injection Layer | 1.56 | 1.54 |
| Hole Transport Layer | 1.89 | 1.73 |
| Light Emitting Layer | 1.94 | 1.89 |
| Electron Auxiliary Layer | 1.62 | 1.60 |

Fresnel Coefficient=$(n_2-n_1/n_2+n_1)^2$ ($n_1$: refractive index of the first layer, nz: refractive index of the second layer)

Thin film interference:

(a) Optical density=2nd=m$\lambda$ (n: refractive index, d: distance between electrodes, m=integer, $\lambda$: wavelength)

Wide angle interference:

(a) Optical density=2nx={(m−1)+½}×$\lambda$ (n: refractive index, d: distance between light emitting layer and reflective layer, m=integer, $\lambda$: wavelength)

Figure 10:
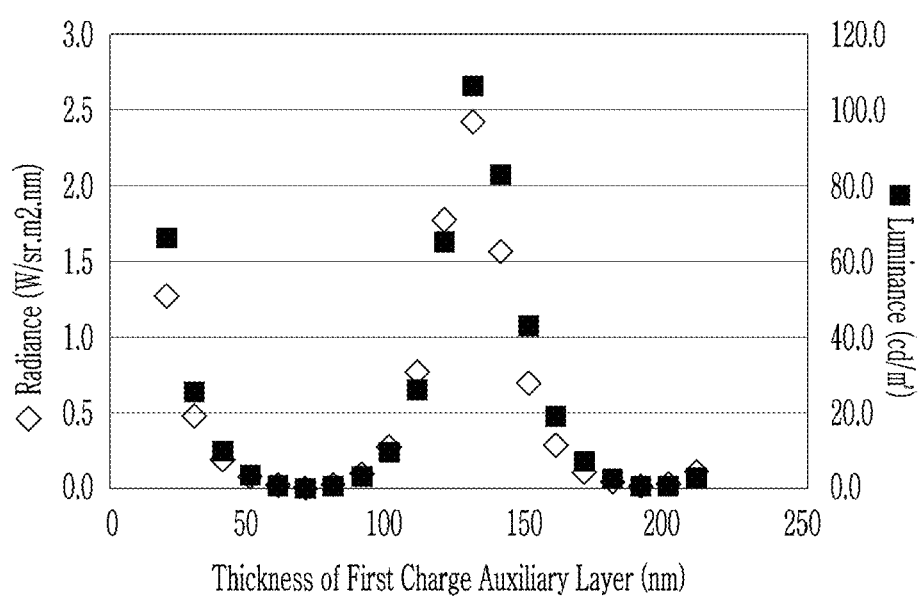
FIG. 10 is a graph showing the change in light-emitting characteristic according to the thickness of the first charge auxiliary layer of blue light emitting device.
Figure 11:
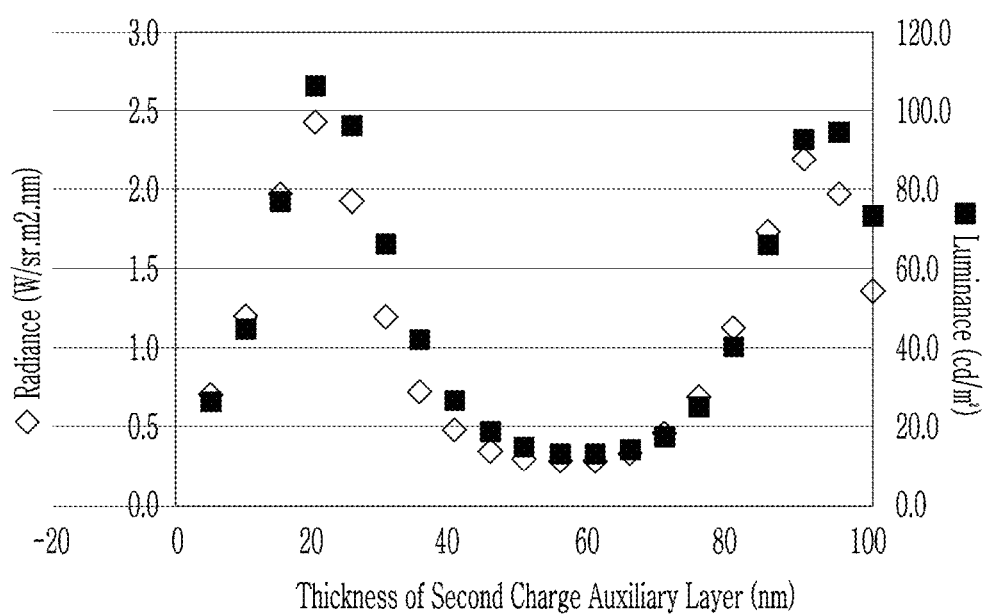
FIG. 11 is a graph showing the change in light-emitting characteristic according to the thickness of the second charge auxiliary layer of blue light emitting device.
Figure 12:
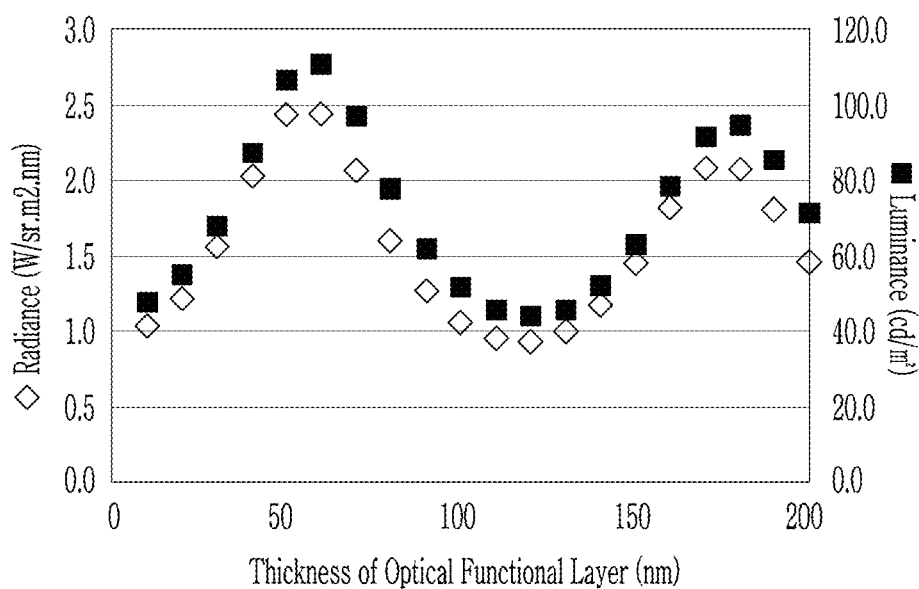
FIG. 12 is a graph showing the change in light-emitting characteristic according to the thickness of the optical functional layer of blue light emitting device.
Figure 13:
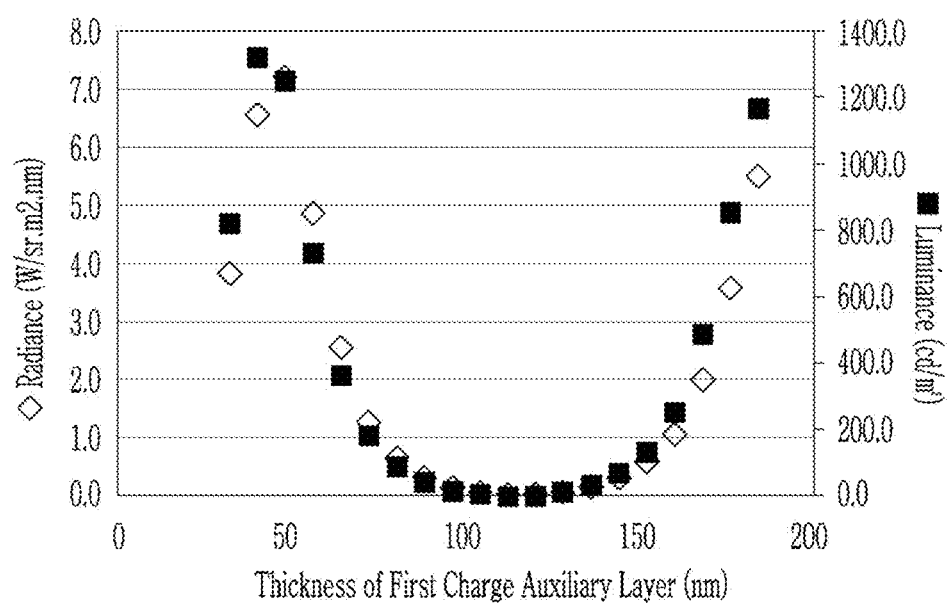
FIG. 13 is a graph showing the change in light-emitting characteristic according to the thickness of the first charge auxiliary layer of red light emitting device.
Figure 14:
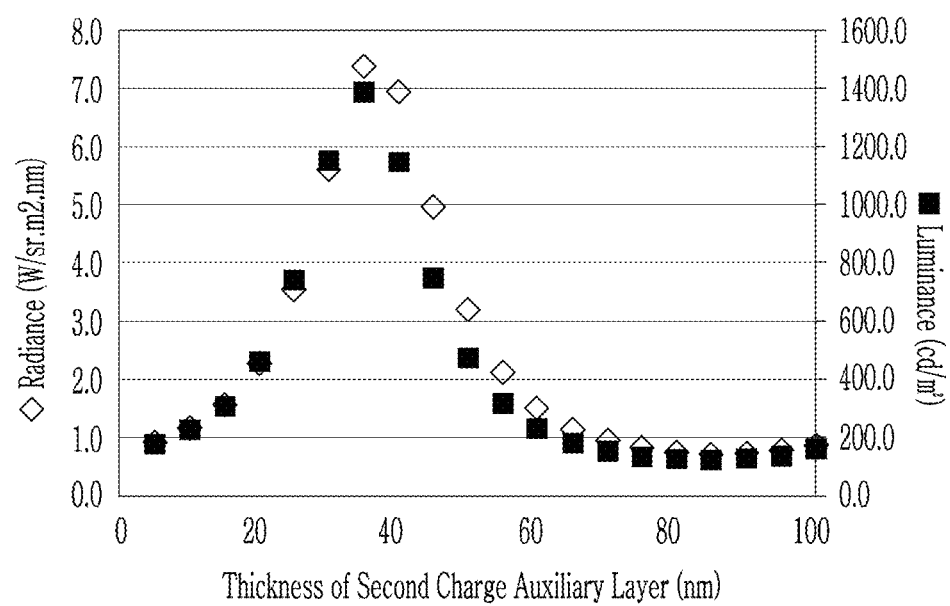
FIG. 14 is a graph showing the change in light-emitting characteristic according to the thickness of the second charge auxiliary layer of red light emitting device.
Figure 15:
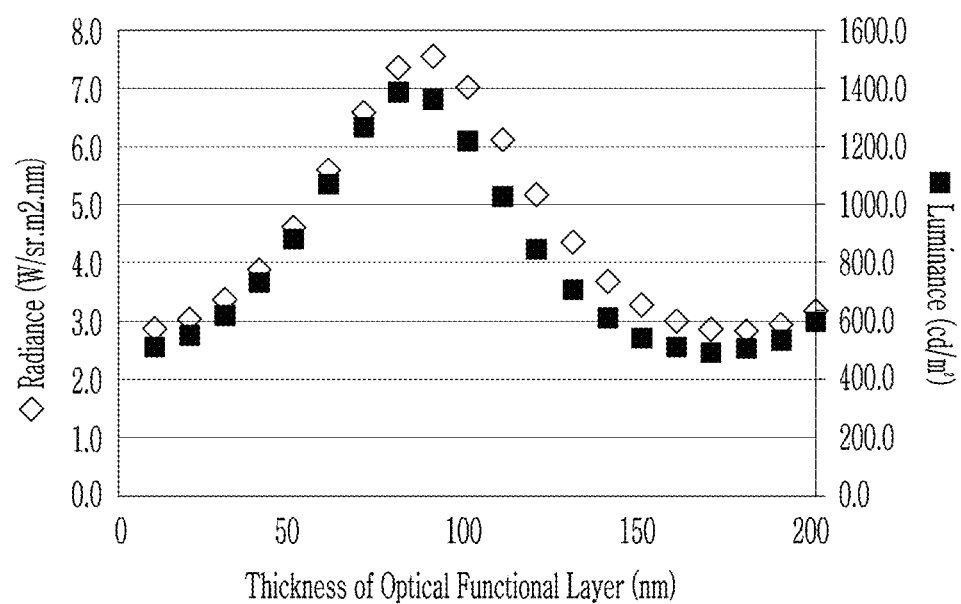
FIG. 15 is a graph showing the change in light-emitting characteristic according to the thickness of the optical functional layer of red light emitting device.

FIG. 10 is a graph showing the change in light-emitting characteristic according to the thickness of the first charge auxiliary layer of blue light emitting device, FIG. 11 is a graph showing the change in light-emitting characteristic according to the thickness of the second charge auxiliary layer of blue light emitting device, FIG. 12 is a graph showing the change in light-emitting characteristic according to the thickness of the optical functional layer of blue light emitting device, FIG. 13 is a graph showing the change in light-emitting characteristic according to the thickness of the first charge auxiliary layer of red light emitting device, FIG. 14 is a graph showing the change in light-emitting characteristic according to the thickness of the second charge auxiliary layer of red light emitting device, and FIG. 15 is a graph showing the change in light-emitting characteristic according to the thickness of the optical functional layer of red light emitting device.

In FIG. 10, in blue light emitting device having a microcavity structure, light extraction efficiency according to a thickness of the first charge auxiliary layer (a hole injection layer, a hole transport layer, or a combination thereof) is obtained, when a thickness of the second charge auxiliary layer is about 20 nm and a thickness of the optical functional layer is about 50 nm.

In FIG. 11, in blue light emitting device having a microcavity structure, light extraction efficiency according to a thickness of the second charge auxiliary layer is obtained, when a thickness of the first charge auxiliary layer (a hole injection layer, a hole transport layer, or a combination thereof) is about 140 nm and a thickness of the optical functional layer is about 50 nm.

In FIG. 12, in blue light emitting device having a microcavity structure, light extraction efficiency according to a thickness of the optical functional layer is obtained, when a thickness of the first charge auxiliary layer (a hole injection layer, a hole transport layer, or a combination thereof) is about 140 nm and a thickness of the second charge auxiliary layer is about 20 nm.

Referring to FIGS. 10 to 12, it is confirmed that the thickness ranges of the first charge auxiliary layer, the second charge auxiliary layer, and the optical functional layer capable of optimizing the light extraction efficiency by microcavity structure in the blue light emitting device are present.

In FIG. 13, in red light emitting device having a microcavity structure, light extraction efficiency according to a thickness of the first charge auxiliary layer (a hole injection layer, a hole transport layer, or a combination thereof) is obtained, when a thickness of the second charge auxiliary layer is about 30 nm and a thickness of the optical functional layer is about 80 nm.

In FIG. 14, in red light emitting device having a microcavity structure, light extraction efficiency according to a thickness of the second charge auxiliary layer is obtained, when a thickness of the first charge auxiliary layer (a hole injection layer, a hole transport layer, or a combination thereof) is about 55 nm and a thickness of the optical functional layer is about 80 nm.

In FIG. 15, in blue light emitting device having a microcavity structure, light extraction efficiency according to a thickness of the optical functional layer is obtained, when a thickness of the first charge auxiliary layer (a hole injection layer, a hole transport layer, or a combination thereof) is about 55 nm and a thickness of the second charge auxiliary layer is about 30 nm.

Referring to FIGS. 13 to 15, it is confirmed that the thickness ranges of the first charge auxiliary layer, the second charge auxiliary layer, and the optical functional layer capable of optimizing the light extraction efficiency by microcavity structure in the red light emitting device are present.

In addition, referring to FIGS. 10 to 15, it is confirmed that the thickness ranges of each layer capable of optimizing the light extraction efficiency in the blue light emitting device and the red light emitting device having a microcavity structure are different from each other.

Manufacture of Light Emitting Device II

Example 5

ITO 10 nm, Ag 1000 nm and ITO 10 nm are sequentially deposited on a glass substrate to form an anode. The anode is surface-treated using UV-ozone. Thereafter, PEDOT:PSS solution is spin-coated on the anode and then heat-treated at 150° C. for 30 minutes under the nitrogen atmosphere to form a hole injection layer (n=1.56@460 nm) in a thickness of 30 nm. Thereafter, the polymer solution including polymer A is spin-coated on the hole injection layer and then heat-treated at 150° C. for 30 minutes under the nitrogen atmosphere to form a hole transport layer (n=1.68@460 nm) in a thickness of 95 nm. The polymer A has a structure in which alkyl-substituted fluorene structural units and phenyl substituted carbazolyl-substituted triphenylamine structural units. Thereafter, blue quantum dots which are dispersed in an organic solvent are spin-coated on the hole transport layer and heat-treated at 80° C. for 30 minutes under the nitrogen atmosphere to form a first blue emission layer (n=1.94@460 nm, $\lambda_{max}$=453 nm) in a thickness of 20 nm. Thereafter, blue quantum dots which are dispersed in an organic solvent are spin-coated on the first blue emission layer and heat-treated at 80° C. for 30 minutes under the nitrogen atmosphere to form a second blue emission layer (n=1.94@460 nm, $\lambda_{max}$=453 nm) in a thickness of 20 nm. Thereafter, $Zn_{0.85}Mg_{0.15}O$ nanoparticles which are dispersed in an alcohol are spin-coated on the second blue emission layer and then heat-treated at 140° C. for 30 minutes to form an electron auxiliary layer (n=1.62@460 nm) in a thickness of 20 nm. Thereafter, Mg—Ag (90:10 w/w) is deposited on the electron auxiliary layer to form a cathode in a thickness of 12 nm. Then an optical functional layer is formed on a cathode in a thickness of 55 nm in the same way as Example 1 to provide a top emission typed blue light emitting device.

Example 6

A top emission typed blue light emitting device is manufactured in accordance with the same procedure as in Example 5, except that the first and second blue emission layers ($\lambda_{max}$=462 nm) are formed instead of the first and second blue emission layers ($\lambda_{max}$=453 nm); and the hole transport layer in a thickness of 105 nm is formed instead of the hole transport layer in a thickness of 95 nm.

Example 7

A top emission typed blue light emitting device is manufactured in accordance with the same procedure as in Example 5, except that the hole transport layer (n=1.89@460 nm) in a thickness of 100 nm is formed by spin-coating a poly(9,9-dioctyl-fluorene-co-N-(4-butylphenyl)-diphenylamine) (TFB), instead of the polymer solution including polymer A, and heat-treating at 150° C. for 30 minutes.

Example 8

ITO 10 nm, Ag 1000 nm and ITO 10 nm are sequentially deposited on a glass substrate to form an anode. The anode is surface-treated using UV-ozone. Thereafter, PEDOT:PSS solution is spin-coated on the anode and then heat-treated at 150° C. for 30 minutes under the nitrogen atmosphere to form a hole injection layer (n=1.56@460 nm) in a thickness of 30 nm. Thereafter, a poly(9,9-dioctyl-fluorene-co-N-(4-butylphenyl)-diphenylamine) (TFB) is spin-coated on the hole injection layer and then heat-treated at 150° C. for 30 minutes to form a hole transport layer (n=1.89@460 nm) in a thickness of 110 nm. Thereafter, blue quantum dots which are dispersed in an octane are spin-coated on the hole transport layer and heat-treated at 80° C. for 30 minutes under the nitrogen atmosphere to form a blue emission layer (n=2.18@460 nm, $\lambda_{max}$=453 nm) in a thickness of 28 nm. Thereafter, $Zn_{0.85}Mg_{0.15}O$ nanoparticles which are dispersed in an alcohol are spin-coated on the blue emission layer and then heat-treated at 140° C. for 30 minutes to form an electron auxiliary layer (n=1.62@460 nm) in a thickness of 20 nm. Thereafter, Mg—Ag (90:10 w/w) is deposited on the electron auxiliary layer to form a cathode in a thickness of 13 nm. Then, an optical functional layer is formed on a cathode in a thickness of 50 nm in the same way as Example 1 to provide a top emission typed blue light emitting device.

Example 9

A top emission typed blue light emitting device is manufactured in accordance with the same procedure as in Example 8, except that the blue emission layer ($\lambda_{max}$=462 nm) are formed instead of the blue emission layer ($\lambda_{max}$=453 nm); and the electron auxiliary layer in a thickness of 30 nm is formed instead of the electron auxiliary layer in a thickness of 20 nm.

Comparative Example 4

A top emission typed blue light emitting device is manufactured in accordance with the same procedure as in Example 8, except that the hole transport layer in a thickness of 25 nm is formed instead of the hole transport layer in a thickness of 100 nm.

Comparative Example 5

A bottom emission typed blue light emitting device is manufactured in accordance with the same procedure as in Example 8, except that only ITO is deposited, instead of ITO 10 nm, Ag 1000 nm and ITO 10 nm, to form an anode in a thickness of 150 nm; Al is deposited, instead of Mg—Ag, to form a cathode in a thickness of 120 nm; and the hole transport layer in a thickness of 25 nm is formed instead of the hole transport layer in a thickness of 100 nm; and not forming the optical functional layer.

Evaluation 5

The light emitting characteristics of the blue light emitting devices according of Examples 5 to 9 and Comparative Examples 4 and 5 are evaluated.

The light emitting characteristics are measured using Current-Voltage-Luminance measuring equipment (Keithley 2200, Minolta CS200).

The results are in Table 2.

TABLE 2

|  | $EQE_{max}$(%) | $\lambda_{max}$ (nm) | FWHM(nm) | $CIE_x$ | $CIE_y$ |
|---|---|---|---|---|---|
| Example 5 | 28.2 | 450 | 14 | 0.1530 | 0.0230 |
| Example 6 | 19.4 | 461 | 19 | 0.1361 | 0.0499 |
| Example 7 | 23.6 | 452 | 14 | 0.1520 | 0.0240 |
| Example 8 | 17.8 | 450 | 16 | 0.1530 | 0.0230 |
| Example 9 | 19.6 | 462 | 20 | 0.1420 | 0.038 |
| Comparative Example 4 | 1.7 | 455 | 32 | 0.1830 | 0.1770 |
| Comparative Example 5 | 6.2 | 453 | 24 | 0.1508 | 0.0856 |

* $EQE_{max}$: maximum external quantum efficiency
* $\lambda_{max}$: maximum wavelength
* FWHM: full width at half maximum Referring to Table 2, it is confirmed that the blue light emitting devices according to Examples 5 to 9 have improved efficiency and color purity compared to the blue light emitting devices according to Comparative Examples 4 and 5.

Manufacture of Light Emitting Device III

Example 10

ITO 10 nm, Ag 1000 nm and ITO 10 nm are sequentially deposited on a glass substrate to form an anode. The anode is surface-treated using UV-ozone. Thereafter, PEDOT:PSS solution is spin-coated on the anode and then heat-treated at 150° C. for 30 minutes under the nitrogen atmosphere to form a hole injection layer (n=1.54@630 nm) in a thickness of 30 nm. Thereafter, a poly(9,9-dioctyl-fluorene-co-N-(4-butylphenyl)-diphenylamine) (TFB) is spin-coated on the hole injection layer and then heat-treated at 150° C. for 30 minutes to form a hole transport layer (n=1.73@630 nm) in a thickness of 25 nm. Thereafter, red quantum dots which are dispersed in an octane are spin-coated on the hole transport layer and heat-treated at 120° C. for 30 minutes under the nitrogen atmosphere to form a red emission layer (n=1.89@630 nm) in a thickness of 20 nm. Thereafter, $Zn_{0.85}Mg_{0.15}O$ nanoparticles which are dispersed in an alcohol are spin-coated on the red emission layer and then heat-treated at 140° C. for 30 minutes to form an electron auxiliary layer (n=1.60@630 nm) in a thickness of 30 nm. Thereafter, Mg—Ag (90:10 w/w) is deposited on the electron auxiliary layer to form a cathode in a thickness of 12 nm. Then, an optical functional layer is formed on a cathode in a thickness of 80 nm in the same way as Example 1 to provide a top emission typed red light emitting device.

Comparative Example 6

A top emission typed red light emitting device is manufactured in accordance with the same procedure as in Example 10, except that the hole transport layer in a thickness of 60 nm is formed instead of the hole transport layer in a thickness of 25 nm.

Comparative Example 7

A bottom emission typed red light emitting device is manufactured in accordance with the same procedure as in Example 10, except that only ITO is deposited, instead of ITO 10 nm, Ag 1000 nm and ITO 10 nm, to form an anode in a thickness of 150 nm; Al is deposited, instead of Mg—Ag, to form a cathode in a thickness of 120 nm; and the electron auxiliary layer in a thickness of 40 nm is formed instead of the electron auxiliary layer in a thickness of 30 nm; and not forming the optical functional layer.

Evaluation 6

The light emitting characteristics of the red light emitting device according of Example 10 and Comparative Examples 6 and 7 are evaluated.

The results are in Table 3.

TABLE 3

|  | Example 10 | Comparative Example 6 | Comparative Example 7 |
|---|---|---|---|
| $EQE_{max}$(%) | 29.7 | 4.8 | 21.0 |
| EQE@5000 nit | 27.1 | 4.7 | 19.1 |
| EQE@420 mA/cm² | 22.3 | 3.4 | 11.0 |
| $Cd/A_{max}$ | 37.6 | 4.6 | 25.1 |
| $\lambda_{max}$ (nm) | 628 | 633 | 629 |
| FWHM(nm) | 31 | 39 | 36 |
| $CIE_x$ | 0.6910 | 0.696 | 0.6890 |
| $CIE_y$ | 0.3090 | 0.304 | 0.3110 |

* EQE@5000 nit: EQE at 5000 nit
* EQE@420 mA/cm²: EQE at 420 mA/cm²
* Cd/Amax: Maximum current efficiency Referring to Table 3, it is confirmed that the red light emitting device according to Example 10 has improved efficiency and color purity compared to the red light emitting devices according to Comparative Examples 6 and 7.

Evaluation 7

The life-span characteristics of the red light emitting device according of Example 10 and Comparative Examples 6 and 7 are evaluated.

The life-span characteristics is evaluated from the luminance reduction amount for the initial luminance while injecting a current satisfying the condition that the luminance of the red light emitting device shows 4500 nit, and T90 is the time at which a luminance reduction of 90% for the initial luminance.

The results are in Table 4.

TABLE 4

|  | $T_{90}$ (h) |
| --- | --- |
| Example 10 | 60 |
| Comparative Example 6 | <5 |
| Comparative Example 7 | <30 |

Referring to Table 4, it is confirmed that the red light emitting device according to Example 10 has improved life-span characteristics compared to the red light emitting devices according to Comparative Examples 6 and 7.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electronic device comprising:
a first electronic device comprising a first quantum dot, the first quantum dot being configured to emit light in a first wavelength region;
a second electronic device comprising a second quantum dot, the second quantum dot being configured to emit light in a second wavelength region shorter than the first wavelength region; and
a third electronic device comprising a third quantum dot, the third quantum dot being configured to emit light in a third wavelength region shorter than the second wavelength region,
wherein each of the first electronic device, the second electronic device, and the third electronic device comprises:
a first electrode comprising a reflective layer,
a first charge auxiliary layer on the first electrode, the first charge auxiliary layer comprising a hole transport layer, a hole injection layer, or a combination thereof,
an emission layer on the first charge auxiliary layer, the emission layer comprising the first quantum dot, the second quantum dot, or the third quantum dot,
a second electrode on the emission layer, and
an optical functional layer on the second electrode,
wherein a distance between the reflective layer and the emission layer of the third electronic device is in a range of about 100 nanometers to about 160 nanometers, and
a distance between the reflective layer and the emission layer of the first electronic device is different from the distance between the reflective layer and the emission layer of the third electronic device.

2. The electronic device of claim 1, wherein a thickness of the first charge auxiliary layer of the third electronic device is in a range of about 100 nanometers to about 160 nanometers, and
a thickness of the first charge auxiliary layer of the first electronic device is different from the thickness of the first charge auxiliary layer of the third electronic device.

3. The electronic device of claim 2, wherein the thickness of the first charge auxiliary layer of the first electronic device is about 0.1 times to about 0.9 times or about 1.2 times to about 3 times the thickness of the first charge auxiliary layer of the third electronic device.

4. The electronic device of claim 2, wherein the thickness of the first charge auxiliary layer of the first electronic device is in a range of about 30 nanometers to about 80 nanometers or about 230 nanometers to about 280 nanometers.

5. The electronic device of claim 2, wherein a total thickness of the optical functional layer and the first charge auxiliary layer of the first electronic device is in a range of about 40 nanometers to about 170 nanometers or about 240 nanometers to about 370 nanometers.

6. The electronic device of claim 2, wherein a total thickness of the optical functional layer and the first charge auxiliary layer of the third electronic device is in a range of about 120 nanometers to 240 nanometers.

7. The electronic device of claim 1, wherein each of the first electronic device, the second electronic device and the third electronic device further comprises a second charge auxiliary layer between the emission layer and the second electrode, and the second charge auxiliary layer comprises inorganic nanoparticles.

8. The electronic device of claim 7, wherein a refractive index of the second charge auxiliary layer is less than a refractive index of the emission layer.

9. The electronic device of claim 8, wherein a difference between the refractive index of the emission layer and the refractive index of the second charge auxiliary layer is greater than or equal to about 0.20.

10. The electronic device of claim 8, wherein a difference between the refractive index of the emission layer and the refractive index of the second charge auxiliary layer is in a range of about 0.20 to about 1.0.

11. The electronic device of claim 7, wherein the second charge auxiliary layer comprises zinc-containing oxide nanoparticles represented by $Zn_{1-x}Q_xO$ (wherein, Q is Mg, Co, Ni, Ga, Al, Ca, Zr, W, Li, Ti, Ta, Sn, Hf, Si, Ba, or a combination thereof, and $0 \leq x < 0.5$).

12. The electronic device of claim 7, wherein a thickness of the second charge auxiliary layer of the first electronic device is different from a thickness of the second charge auxiliary layer of the third electronic device.

13. The electronic device of claim 12, wherein the thickness of the second charge auxiliary layer of the first electronic device is greater than a thickness of the second charge auxiliary layer of the third electronic device.

14. The electronic device of claim 7, wherein a total thickness of the first charge auxiliary layer, the emission layer, and the second charge auxiliary layer of the first electronic device is in a range of about 75 nanometers to about 135 nanometers or about 270 nanometers to about 330 nanometers.

15. The electronic device of claim 7, wherein a total thickness of the first charge auxiliary layer, the emission layer, and the second charge auxiliary layer of the third electronic device is in a range of about 160 nanometers to about 230 nanometers.

16. The electronic device of claim 1, wherein the optical functional layers of the first electronic device, the second electronic device, and the third electronic device have the same thickness.

17. The electronic device of claim 1, wherein the emission layers of the first electronic device, the second electronic device, and the third electronic device have the same thickness.

18. The electronic device of claim 1, wherein a full width at half maximum of wavelength spectrum of color displayed by the first electronic device is narrower than a full width at half maximum of emission spectrum of the emission layer of the first electronic device, and
a full width at half maximum of wavelength spectrum of color displayed by the third electronic device is narrower than a full width at half maximum of emission spectrum of the emission layer of the third electronic device.

19. A display device comprising the electronic device of claim 1.

20. An electronic device comprising
a first electrode comprising a reflective layer,
a first charge auxiliary layer on the first electrode, the first charge auxiliary layer comprising a hole transport layer, a hole injection layer, or a combination thereof,
an emission layer on the first charge auxiliary layer, the emission layer comprising a quantum dot configured to emit a light in a blue wavelength region,
a second electrode on the emission layer, and
an optical functional layer on the second electrode,
wherein a distance between the reflective layer and the emission layer is in a range of about 100 nanometers to about 160 nanometers.

21. The electronic device of claim 20, wherein a thickness of the first charge auxiliary layer is in a range of about 100 nanometers to about 160 nanometers.

22. The electronic device of claim 21, wherein a total thickness of the optical functional layer and the first charge auxiliary layer is in a range of about 120 nanometers to about 240 nanometers.

23. The electronic device of claim 21, further comprising a second charge auxiliary layer between the emission layer and the second electrode, wherein the second charge auxiliary layer comprises inorganic nanoparticles.

24. The electronic device of claim 23, wherein a refractive index of the second charge auxiliary layer is less than a refractive index of the emission layer, and a difference between the refractive index of the emission layer and the refractive index of the second charge auxiliary layer is greater than or equal to 0.20.

25. The electronic device of claim 23, wherein the second charge auxiliary layer comprises zinc-containing oxide nanoparticles represented by $Zn_{1-x}Q_xO$ (wherein, Q is Mg, Co, Ni, Ga, Al, Ca, Zr, W, Li, Ti, Ta, Sn, Hf, Si, Ba, or a combination thereof, and 0≤x<0.5).

26. The electronic device of claim 23, wherein a total thickness of the first charge auxiliary layer, the emission layer, and the second charge auxiliary layer is in a range of about 160 nanometers to about 230 nanometers.

27. The electronic device of claim 20, wherein a full width at half maximum of wavelength spectrum of color displayed by the electronic device is narrower than a full width at half maximum of emission spectrum of the emission layer.

28. A display device comprising the electronic device of claim 20.

29. An electronic device comprising
a first electrode comprising a reflective layer,
a first charge auxiliary layer on the first electrode, the first charge auxiliary layer comprising a hole transport layer, a hole injection layer, or a combination thereof,
an emission layer on the first charge auxiliary layer, the emission layer comprising a quantum dot configured to emit a light in a red wavelength region,
a second electrode on the emission layer, and
an optical functional layer on the second electrode,
wherein a distance between the reflective layer and the emission layer is in a range of about 30 nanometers to about 80 nanometers or about 230 nanometers to about 280 nanometers, and
wherein a full width at half maximum of wavelength spectrum of color displayed by the electronic device is narrower than a full width at half maximum of emission spectrum of the emission layer.

30. The electronic device of claim 29, wherein a thickness of the first charge auxiliary layer is in a range of about 30 nanometers to about 80 nanometers or about 230 nanometers to 280 nanometers.

31. The electronic device of claim 30, wherein a total thickness of the optical functional layer and the first charge auxiliary layer is in a range of about 40 nanometers to about 170 nanometers or about 240 nanometers to 370 nanometers.

32. The electronic device of claim 29, further comprising a second charge auxiliary layer between the emission layer and the second electrode, wherein the second charge auxiliary layer comprises inorganic nanoparticles.

33. The electronic device of claim 32, wherein a refractive index of the second charge auxiliary layer is less than a refractive index of the emission layer, and a difference between the refractive index of the emission layer and the refractive index of the second charge auxiliary layer is greater than or equal to about 0.20.

34. The electronic device of claim 32, wherein the second charge auxiliary layer comprises zinc-containing oxide nanoparticles represented by $Zn_{1-x}Q_xO$ (wherein, Q is Mg, Co, Ni, Ga, Al, Ca, Zr, W, Li, Ti, Ta, Sn, Hf, Si, Ba, or a combination thereof, and 0≤x<0.5).

35. The electronic device of claim 32, wherein a total thickness of the first charge auxiliary layer, the emission layer, and the second charge auxiliary layer is in a range of about 75 nanometers to about 135 nanometers or about 270 nanometers to 330 nanometers.

36. A display device comprising the electronic device of claim 29.

* * * * *